(12) United States Patent
Maeda et al.

(10) Patent No.: US 10,840,244 B2
(45) Date of Patent: Nov. 17, 2020

(54) SEMICONDUCTOR DEVICE

(71) Applicant: Samsung Electronics Co., Ltd., Suwon-si (KR)

(72) Inventors: Shigenobu Maeda, Seongnam-si (KR); Sung Chul Park, Seongnam-si (KR); Chul Hong Park, Seongnam-si (KR); Yoshinao Harada, Hwaseong-si (KR); Sung Min Kang, Suwon-si (KR); Ji Wook Kwon, Daejeon (KR); Ha-Young Kim, Seoul (KR); Yuichi Hirano, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/372,166

(22) Filed: Apr. 1, 2019

(65) Prior Publication Data
US 2019/0355719 A1 Nov. 21, 2019

(30) Foreign Application Priority Data
May 17, 2018 (KR) ........................ 10-2018-0056538

(51) Int. Cl.
*H01L 27/088* (2006.01)
*H01L 29/40* (2006.01)
*H01L 29/06* (2006.01)

(52) U.S. Cl.
CPC ...... *H01L 27/0886* (2013.01); *H01L 29/0607* (2013.01); *H01L 29/404* (2013.01)

(58) Field of Classification Search
CPC .............. H01L 27/0886; H01L 29/404; H01L 29/0607; H01L 29/7846; H01L 21/823821
See application file for complete search history.

(56) References Cited

U.S. PATENT DOCUMENTS

| | | | |
|---|---|---|---|
| 8,748,312 | B2 | 6/2014 | Seo et al. |
| 9,412,616 | B1 | 8/2016 | Xie et al. |
| 9,653,583 | B1 | 5/2017 | Zhao et al. |
| 9,935,104 | B1 | 4/2018 | Wang et al. |
| 2017/0317078 | A1 | 11/2017 | Chang et al. |
| 2017/0352675 | A1 | 12/2017 | Mihara |
| 2017/0373144 | A1 | 12/2017 | Pandey |
| 2018/0006135 | A1 | 1/2018 | Shen |
| 2018/0040621 | A1 | 2/2018 | Liaw |
| 2018/0083036 | A1 | 3/2018 | Agarwal et al. |

*Primary Examiner* — Anthony Ho
(74) *Attorney, Agent, or Firm* — Muir Patent Law, PLLC

(57) ABSTRACT

A semiconductor device includes first to fourth cells sequentially disposed on a substrate, first to third diffusion break structures, a first fin structure configured to protrude from the substrate, the first fin structure comprising first to fourth fins separated from each other by the first to third diffusion break structures, a second fin structure configured to protrude from the substrate, to be spaced apart from the first fin structure, the second fin structure comprising fifth to eighth fins separated from each other by the first to third diffusion break structures, the first to fourth gate electrodes being disposed in the first to fourth cells, respectively, and the number of fins in one cell of the first to fourth cells is different from the number of fins in an other cell of the first to fourth cells.

20 Claims, 34 Drawing Sheets

SEMICONDUCTOR DEVICE

This application claims priority from Korean Patent Application No. 10-2018-0056538 filed on May 17, 2018 in the Korean Intellectual Property Office, the disclosure of which is incorporated herein by reference in its entirety.

BACKGROUND

1. Field of the Disclosure

The present disclosure relates to a semiconductor device.

2. Description of the Related Art

A semiconductor device includes an integrated circuit (IC) including a metal-oxide-semiconductor field-effect transistor (MOSFET). As sizes and design rules of semiconductor devices are gradually reduced, MOSFETs are increasingly rapidly downscaled. The downscaling of the MOSFETs may cause a short channel effect, thereby degrading operating characteristics of the semiconductor devices. Thus, research has been conducted into various methods for forming semiconductor devices having better performance by overcoming limitations due to an increase in the integration density of the semiconductor devices.

Furthermore, an IC aims to obtain high operation reliability and low power consumption. Accordingly, research has also been conducted into methods for forming a device having higher reliability and lower power consumption in a smaller space.

SUMMARY

Aspects of the present disclosure provide a semiconductor device having improved operation performance.

According to an aspect of the present inventive concept, there is provided a semiconductor device, the semiconductor device comprising first to fourth cells sequentially disposed on a substrate in a first direction, first to third diffusion break structures configured to space the first to fourth cells apart from each other, the first diffusion break structure being interposed between the first and second cells, the second diffusion break structure being interposed between the second and third cells, and the third diffusion break structure being interposed between the third and fourth cells, a first fin structure configured to protrude from the substrate and extend in the first direction, the first fin structure comprising first to fourth fins separated from each other by the first to third diffusion break structures, a second fin structure configured to protrude from the substrate, to be spaced apart from the first fin structure in a second direction intersecting the first direction and extend in the first direction, the second fin structure comprising fifth to eighth fins separated from each other by the first to third diffusion break structures and first to fourth gate electrodes configured to extend in the second direction on the first and second fin structures, the first to fourth gate electrodes being disposed in the first to fourth cells, respectively, wherein each of the first to fourth gate electrodes interests the first fin structure at an n region of the substrate and interests the second fin structure at a p region of the substrate, and the number of fins in one cell of the first to fourth cells is different from the number of fins in an other cell of the first to fourth cells.

According to another aspect of the present inventive concept, there is provided a semiconductor device, the semiconductor device comprising a substrate comprising an n region and a p region, a first fin provided with the substrate in the n region, and extending in a first direction, a second fin provided with the substrate in the p region, and extending in the first direction, the second fin being spaced apart from the first fin in a second direction intersecting the first direction, a gate electrode configured to extend in the second direction on the first and second fins, a field insulating film configured to be in contact with a side surface of the first fin in the first direction, a first dummy gate formed on the n region and formed on a top surface of the field insulating film and a top surface of the first fin, the first dummy gate being configured to extend in the second direction; and a single diffusion break film formed on the p region and aligned with the first dummy gate in the second direction, the single diffusion break film being in contact with the side surface of the second fin in the first direction.

According to still another aspect of the present inventive concept, there is provided a semiconductor device, the semiconductor device comprising a substrate, a first power rail and a second power rail configured to extend in a first direction on the substrate, the first and second power rails being spaced apart from each other in a second direction intersecting the first direction, a first fin configured to protrude from the substrate and extend in the first direction, a second fin configured to protrude from the substrate and extend in the first direction, the second fin being spaced apart from the first fin in the second direction, a first diffusion break structure and a second diffusion break structure configured to define both ends of the first and second fins and a gate electrode configured to extend on the first and second fins in the second direction, wherein the first fin is a fin nearest to the first power rail in the second direction, the second fin is a fin nearest to the second power rail in the second direction, and the first fin and the second fin have no fins between them in the second direction.

It should be noted that objects of the present disclosure are not limited to the above-described objects, and other objects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Hereinafter, a semiconductor device according to some exemplary embodiments of the present disclosure will be described with reference to FIGS. 1 to 3, 4A, 4B, 5A, and 5B.

Figure 1:
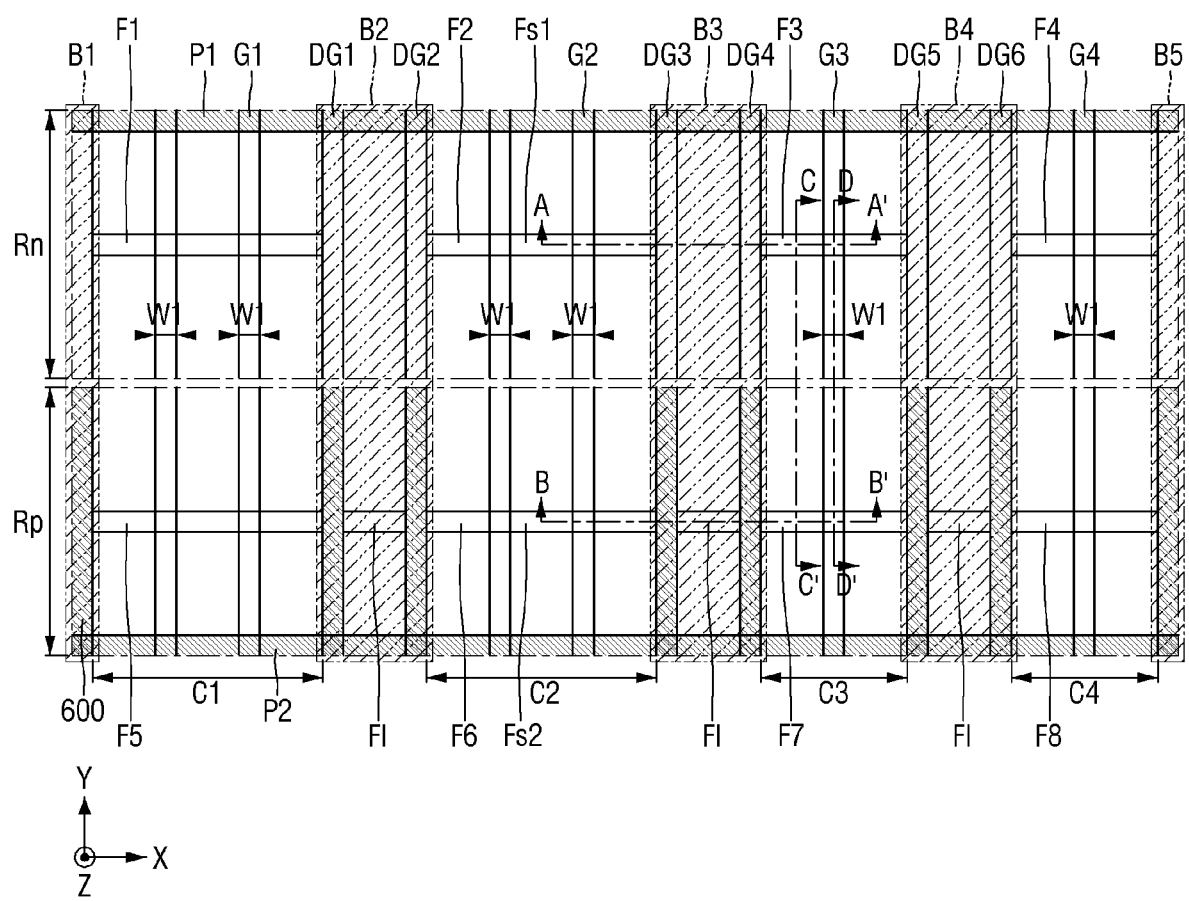
FIG. 1 is a layout diagram for illustrating a semiconductor device according to some exemplary embodiments of the present disclosure.
Figure 2:
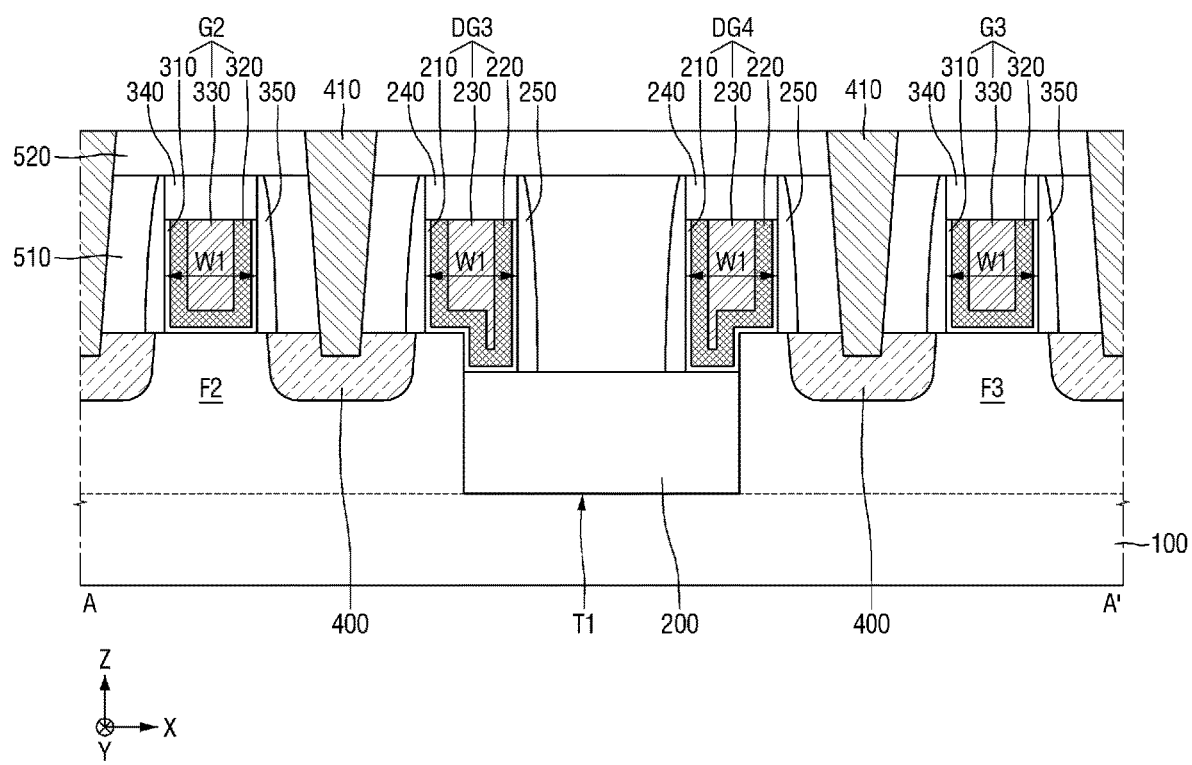
FIG. 2 is a cross-sectional view taken along line A-A' of FIG. 1.
Figure 3:
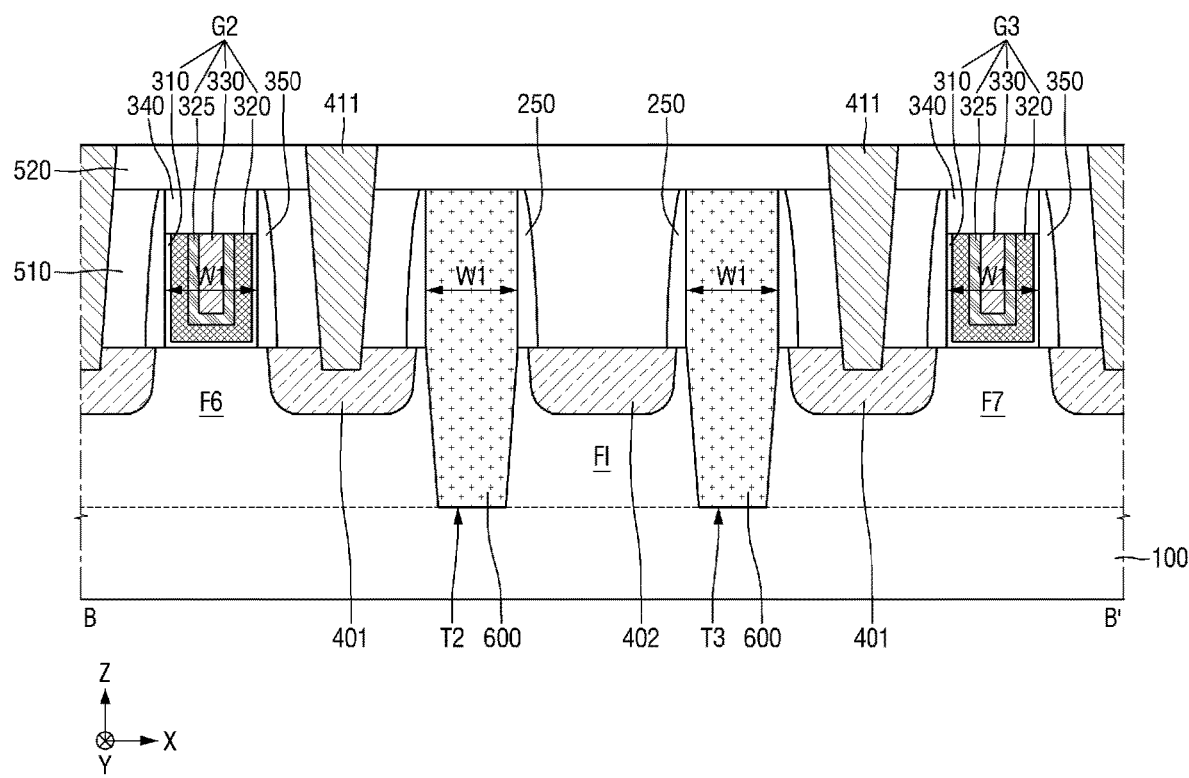
FIG. 3 is a cross-sectional view taken along line B-B' of FIG. 1.
Figure 4A:
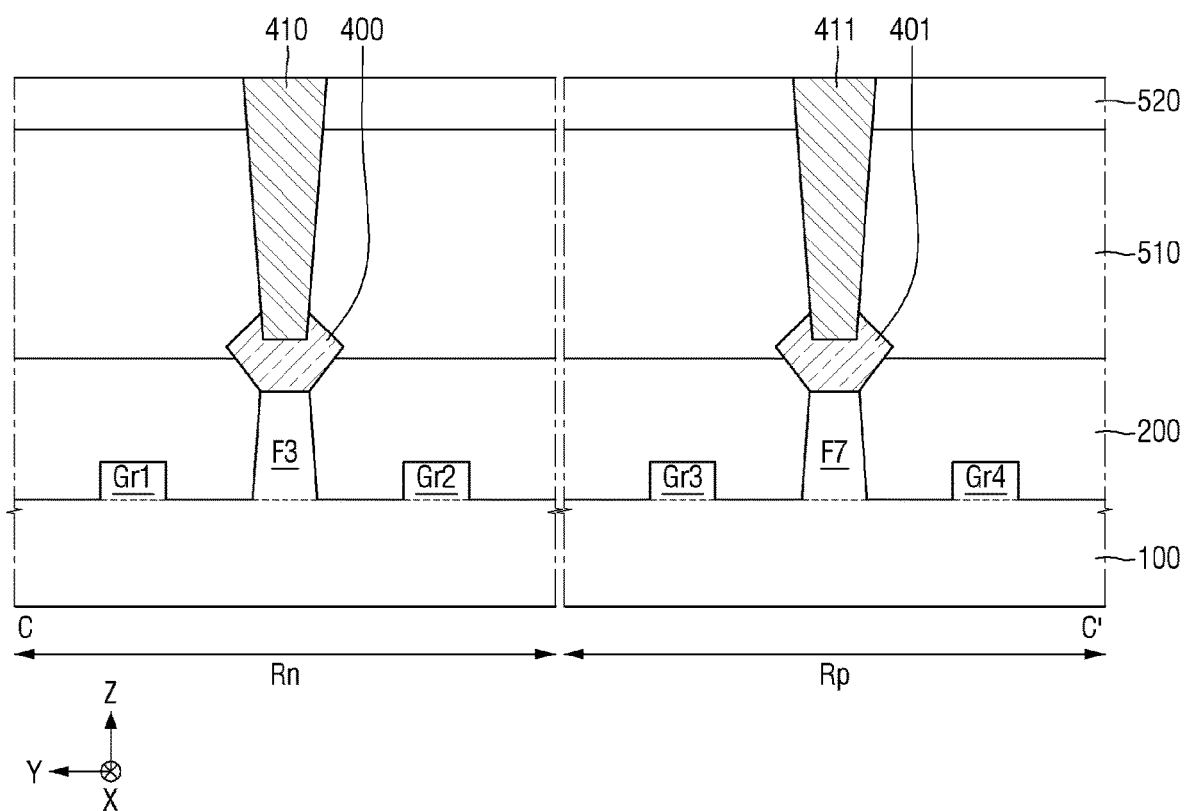
FIG. 4A is a cross-sectional view taken along line C-C' of FIG. 1.
Figure 5A:
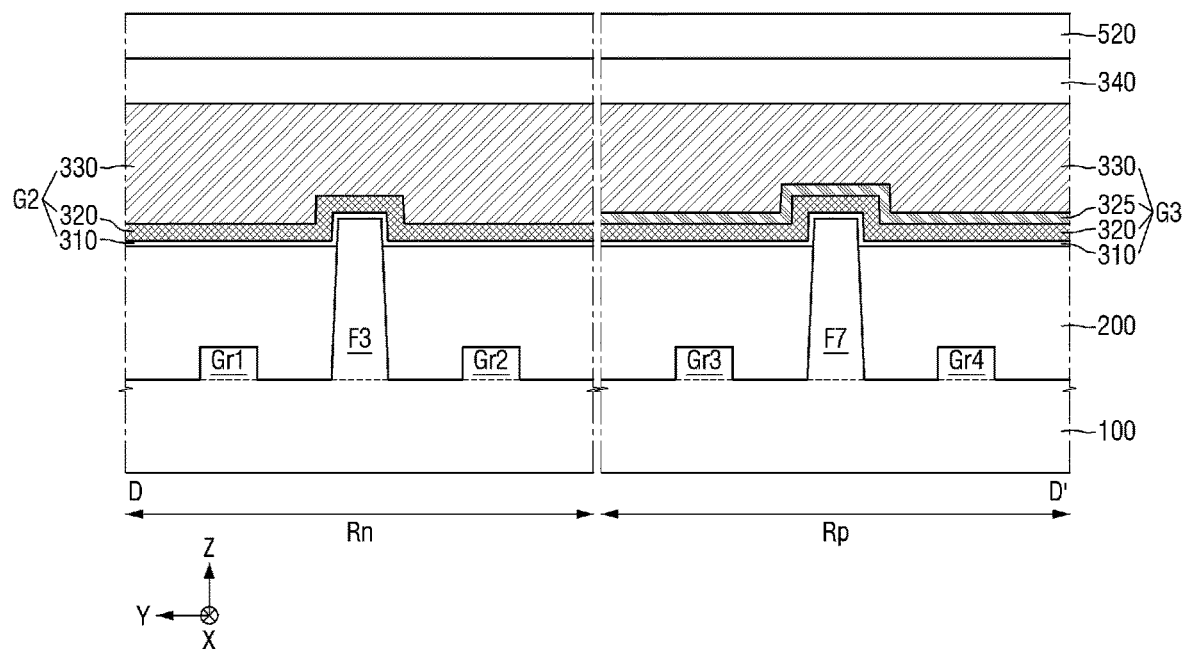
FIG. 5A is a cross-sectional view taken along line D-D' of FIG. 1.

FIG. 1 is a layout diagram for illustrating a semiconductor device according to some exemplary embodiments of the present disclosure, and FIG. 2 is a cross-sectional view taken along line A-A' of FIG. 1. FIG. 3 is a cross-sectional view taken along line B-B' of FIG. 1. FIG. 4A is a cross-sectional view taken along line C-C' of FIG. 1. FIG. 5A is a cross-sectional view taken along line D-D' of FIG. 1.

Referring to FIGS. 1 to 3, 4A, and 4B, the semiconductor device according to some exemplary embodiments of the present disclosure may include a substrate 100, first to fourth cells C1 to C4, first to fifth diffusion break structures B1 to B5, a first fin structure Fs1, a second fin structure Fs2, first to fourth gate electrodes G1 to G4, a first gate insulating film 310, a first capping film 340, first spacers 350, first source and drain regions 400, second source and drain regions 401, a first interlayer insulating film 510, a second interlayer insulating film 520, a first contact 410, a second contact 411, and the like. The semiconductor device may be a semiconductor chip.

A first direction X may be any one direction of lateral directions. A second direction Y may be a direction intersecting the first direction X, for example, a direction perpendicular to the first direction X. A third direction Z may be a direction intersecting both the first direction X and the second direction Y. For example, the third direction Z may be a direction perpendicular to both the first direction X and the second direction Y. In this case, the first direction X and the second direction Y may be lateral directions perpendicular to each other, and the third direction Z may be a vertical direction. For example, the first direction X, the second direction Y, and the third direction Z may be directions orthogonal to each other.

The substrate 100 may be formed of at least one semiconductor material selected from the group consisting of silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), and indium phosphide (InP). Further, a silicon on insulator (SOI) substrate may be used as the substrate 100.

The substrate 100 may have a plurality of cells formed thereon. Specifically, the substrate 100 may include first to fourth cells C1 to C4. The first to fourth cells C1 to C4 may be sequentially disposed in the first direction X. Each of the first to fourth cells C1 to C4 may be defined by first to fifth diffusion break structure B1 to B5.

Specifically, the first cell C1 may be defined by the first diffusion break structure B1 and the second diffusion break structure B2, and the fourth cell C4 may be defined by the fourth diffusion break structure B4 and the fifth diffusion break structure B5. The second diffusion break structure B2 may be located between the first cell C1 and the second cell C2, and the third diffusion break structure B3 may be located between the second cell C2 and the third cell C3. The fourth diffusion break structure B4 may be located between the third cell C3 and the fourth cell C4.

The first to fourth cells C1 to C4 may each be different circuit modules. For instance, the first cell C1 may be a master latch circuit module of a master-slave latch, and the second cell C2 may be a slave latch circuit module of the master-slave latch. The third cell C3 may be a clock circuit module, and the fourth cell C4 may be an output circuit module. Accordingly, the first to fourth cells C1 to C4 may function as a flip-flop circuit module all together. However, the present disclosure is not limited thereto. Each of the first to fourth cells C1 to C4 may include one standard cell or a plurality of standard cells. A standard cell refers to a unit cell having a specific function, for example, an AND gate, an OR gate, an inverter, and the like.

The first to fifth diffusion break structures B1 to B5 may insulate the first to fourth cells C1 to C4 from each other. For example, the first to fifth diffusion break structures B1 to B5 may separate the first to fourth cells C1 to C4 from each other so that the first to fourth cells C1 to C4 may operate as modules having different functions.

The substrate 100 may include an n region Rn and a p region Rp. As described below, an N-type metal-oxide-semiconductor (NMOS) transistor may be formed in the n region Rn, while a P-type metal-oxide-semiconductor (PMOS) transistor may be formed in the p region Rp. As shown in the drawings, the n region Rn and the p region Rp may be regions that are adjacent to each other in the second direction Y. Accordingly, each of the first to fourth cells C1 to C4 is included in the n region Rn and the p region Rp, and the n region Rn and the p region Rp may be aligned with each other in the first direction X. For example, as shown in FIG. 1, all the n regions Rn may be disposed above in the second direction Y, and all the p regions Rp may be disposed below in the second direction Y. In the semiconductor device according to some exemplary embodiments of the present disclosure, positions of the n region Rn and the p region Rp may be exchanged.

The first fin structure Fs1 may extend in the first direction X. The first fin structure Fs1 may be located in the n region Rn. The first fin structure Fs1 may be separated into first to fourth fins F1 to F4 by the first to fifth diffusion break structures B1 to B5. The first to fourth fins F1 to F4 may be disposed in the first to fourth cells C1 to C4, respectively. In this case, although the first to fourth fins F1 to F4 are aligned with each other in the first direction X, the first to fourth fins F1 to F4 may not be aligned with each other in some embodiments.

The second fin structure Fs2 may extend in the first direction X. The second fin structure Fs2 may be spaced apart from the first fin structure Fs1 in the second direction Y. The second fin structure Fs2 may be located in the p region Rp. The second fin structure Fs2 may be separated into fifth to eighth fins F5 to F8 by the first to fifth diffusion break structures B1 to B5. The fifth to eighth fin F5 to F8 may be disposed in the first to fourth cells C1 to C4, respectively. In this case, although the fifth to eighth fins F5 to F8 are aligned in the first direction X, the fifth to eighth fins F5 to F8 may not be aligned with each other in some embodiments.

The first fin structure Fs1 and the second fin structure Fs2 may protrude from the substrate 100 in the third direction Z, for example, a vertical direction. The first fin structure Fs1 and the second fin structure Fs2 may be portions of the substrate 100 and include an epitaxial layer grown from the substrate 100. The first fin structure Fs1 and the second fin structure Fs2 may include, for example, silicon (Si) or silicon germanium (SiGe).

The first fin structure Fs1 and the second fin structure Fs2 may be located different distances from centers of the first to fourth cells C1 to C4 in the second direction Y. For example, a position of the first fin structure Fs1 may not be symmetrical to a position of the second fin structure Fs2 in the second direction Y. Further, the first fin structure Fs1 and the second fin structure Fs2 may include a compound semiconductor, for example, a Group IV-IV compound semiconductor or a Group III-V compound semiconductor.

For example, when the first fin structure Fs1 and the second fin structure Fs2 include the Group IV-IV compound semiconductor, first to sixth fins F1 to F6 may include a binary compound or a ternary compound including at least two of carbon (C), silicon (Si), germanium (Ge), and tin (Sn) or a compound obtained by doping the binary compound or the ternary compound with a Group IV element.

For example, when the first fin structure Fs1 and the second fin structure Fs2 include the Group III-V compound semiconductor, the first fin structure Fs1 and the second fin structure Fs2 may include one of a binary compound, a ternary compound, or a quaternary compound obtained by combining at least one Group-III element of aluminum (Al), gallium (Ga), and indium (In) with one Group-V element of phosphorus (P), arsenic (As), and antimony (Sb).

In the semiconductor device according to exemplary embodiments of the present disclosure, it is assumed that the first fin structure Fs1 and the second fin structure Fs2 include silicon.

The first to fourth gate electrodes G1 to G4 may extend in the second direction Y. Each of the first to fourth gate electrodes G1 to G4 may be disposed on the first fin structure Fs1 and the second fin structure Fs2 across both the first fin structure Fs1 and the second fin structure Fs2.

The first gate electrode G1 may be disposed in the first cell C1, and the second gate electrode G2 may be disposed in the second cell C2. The third gate electrode G3 may be disposed in the third cell C3, and the fourth gate electrode G4 may be disposed in the fourth cell C4. In this case, the number of each of the first to fourth gate electrodes G1 to G4 may vary according to need and purpose. Although two first gate electrodes G1, two second gate electrodes G2, one third gate electrode G3, and one fourth gate electrode G4 are illustrated in FIG. 1 for brevity, the present disclosure is not limited thereto.

The first to fourth gate electrodes G1 to G4 may all have the same first width W1. As used herein, an expression "the same" may be a concept including a minute difference caused by a manufacturing process.

A first power rail P1 may extend in the first direction X. A second power rail P2 may extend in the first direction X and be spaced apart from the first power rail P1 in the second direction Y. The first power rail P1 and the second power rail P2 may be interconnecting wires formed over the first to fourth gate electrodes G1 to G4.

In example embodiments, the first power rail P1 may be electrically connected to a ground voltage (e.g., GND or VSS) or a negative voltage less than the ground voltage, and the second power rail P2 may be electrically connected to a power supply voltage (e.g., VDD or VCC) or an internal power supply voltage (e.g., Vint) generated from an internal voltage generator circuit of the semiconductor device. For example, each of the first to fourth cells C1 to C4 may be provided with the ground voltage or the negative voltage through the first power rail P1, and the power supply voltage or the internal power supply voltage through the second power rail P2.

In example embodiments, the first to fifth diffusion break structures B1 to B5 may have different structures in the n region Rn and the p region Rp. Specifically, each of the first to fifth diffusion break structures B1 to B5 may have a double diffusion break film in the n region Rn and two single diffusion break films in the p region Rp. Accordingly, the first to fifth diffusion break structures B1 to B5 may have a structure including a mixed diffusion break (MDB) film in which the double diffusion break film and the single diffusion break film are mixed.

In this case, the double diffusion break film and the single diffusion break film may be formed simultaneously or at different times for each. That is, although the formation of the MDB film may be performed at one time through a series of sequential operations, the MDB film may be finally formed through several discrete operations that are temporally separated by other processes. The double diffusion break film and the single diffusion break film may include the same material or different materials.

Each of the first to fifth diffusion break structures B1 to B5 may include two dummy gate electrodes. Specifically, the second diffusion break structure B2 may include a first dummy gate electrode DG1 and a second dummy gate electrode DG2, and the third diffusion break structure B3 may include a third dummy gate electrode DG3 and a fourth dummy gate electrode DG4. The fourth diffusion break structure B4 may include a fifth dummy gate electrode DG5 and a sixth dummy gate electrode DG6.

In example embodiments, a dummy gate electrode comprises one or more layers formed at the same level and adjacent to a normal gate electrode. A dummy gate electrode is patterned from the same layer(s) forming such normal gate electrode. For example, a dummy gate electrode may be simultaneously formed with a normal gate electrode with the same processes that deposit and pattern the layer(s). In general, dummy gate electrodes in semiconductor devices are not effective to cause transmission of data to external devices. For instance, a dummy gate electrode may not be electrically connected to gates of cells of the semiconductor device, or if a dummy gate electrode is electrically connected to gates of dummy cells (e.g., dummy source and drain) of the semiconductor device, such dummy gate electrodes may not be activated or if activated, may not result in communication of any data in such dummy cells to a source external to the semiconductor device.

The first to sixth dummy gate electrodes DG1 to DG6 may extend in the second direction Y and be disposed parallel to the first to fourth gate electrodes G1 to G4. The first to sixth dummy gate electrodes DG1 to DG6 and the first to fourth gate electrodes G1 to G4 may be spaced the same distance apart from each other in the first direction X. That is, the first to sixth dummy gate electrodes DG1 to DG6 and the first to fourth gate electrodes G1 to G4 may be electrode structures formed at constant intervals and used as gate electrodes or dummy gate electrodes as needed. Accordingly, like the gate electrodes, the dummy gate electrodes may have the first width W1 in the first direction X.

The double diffusion break film may include two dummy gate electrodes, while the single diffusion break film may occupy a space corresponding to one dummy gate electrode. Accordingly, an MDB film in which one double diffusion break film and two single diffusion break films are connected in the second direction Y may occupy a space corresponding to two dummy gate electrodes. For example, each of the first to fifth diffusion break structures B1 to B5 may occupy a space corresponding to two dummy gate electrodes.

The second fin F2 may be separated from the third fin F3 by the third diffusion break structure B3 on the substrate 100. Further, the sixth fin F6 may be separated from the seventh fin F7 by the third diffusion break structure B3 on the substrate 100. Specifically, referring to FIG. 2, the second fin F2 may be separated from the third fin F3 by a first trench T1. The first trench T1 may be partially filled with a first field insulating film 200.

The first field insulating film 200 may be formed on the substrate 100, cover portions of sidewalls of the first fin structure Fs1 and the second fin structure Fs2, and expose upper portions of the first fin structure Fs1 and the second fin structure Fs2.

The first field insulating film 200 may include, for example, at least one of silicon oxide, silicon nitride, silicon oxynitride, and a low-k dielectric material having a lower dielectric constant than silicon oxide. The low-k dielectric material may include, for example, flowable oxide (FOX), tonen silazene (TOSZ), undoped silica glass (USG), borosilica glass (BSG), phosphosilica glass (PSG), borophosphosilica glass (BPSG), plasma-enhanced tetraethyl orthosilicate (PETEOS), fluoride silicate glass (FSG), carbon-doped silicon oxide (CDO), Xerogel, Aerogel, amorphous fluorinated carbon, organo silicate glass (OSG), parylene, bis-benzocyclobutenes (BCB), SiLK, polyimide, a porous polymeric material, or a combination thereof, but the present disclosure is not limited thereto.

The first field insulating film 200 may include a material capable of applying stress to the first fin structure Fs1. When the first field insulating film 200 applies stress to a channel of a transistor formed in the first fin structure Fs1, the mobility of electrodes serving as carriers may be improved.

The second gate electrode G2 and the third gate electrode G3 may be formed on the second fin F2 and the third fin F3, respectively. The second gate electrode G2 and the third gate electrode G3 may include the first gate insulating film 310, a first work-function metal 320, and a first fill metal 330 in the n region Rn.

The first gate insulating film 310 may include an interface film including a silicon oxide film and a high-k dielectric film including a high-k dielectric material. The high-k dielectric film may include a high-k dielectric material having a higher dielectric constant than the silicon oxide film. The high-k dielectric material may include, for example, at least one of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but the present disclosure is not limited thereto.

In this case, the high-k dielectric film may include a dipole forming material to control a threshold voltage of a gate electrode (Hereinafter, a threshold voltage may be referred to with respect to a transistor in a cell). Here, the dipole forming material may include at least one of lanthanum (La), neodymium (Nd), europium (Eu), dysprosium (Dy), holmium (Ho), and ytterbium (Yb). However, the present disclosure is not limited thereto.

The first work-function metal 320 may be formed on the first gate insulating film 310. The first work-function metal 320 may include an n-type work-function control material. The n-type work-function control material may include at least one of titanium nitride (TiN), tantalum nitride (TaN), and titanium aluminum carbide (TiAlC). However, the present embodiment is not limited thereto.

The first fill metal 330 may be formed on the first work-function metal 320. The first fill metal 330 may include at least one of tungsten (W) and titanium nitride (TiN), but the present disclosure is not limited thereto.

The second gate electrode G2 and the third gate electrode G3 may be used as gate electrodes of NMOS transistors in the n region Rn due to the first work-function metal 320 and the first fill metal 330.

The first capping film 340 may be disposed on each of the second gate electrode G2 and the third gate electrode G3. The first capping film 340 may include silicon nitride, but the present disclosure is not limited thereto.

First spacers 350 may be disposed on side surfaces of the second gate electrode G2, the third gate electrode G3, and the first capping film 340. Although the first spacers 350 are exemplarily illustrated as a single film in the drawings, the first spacers 350 may be multiple spacers formed by stacking a plurality of films. Each of the multiple spacers that form the first spacers 350 may have an I shape, an L shape, or a combination thereof according to manufacturing process or purpose. The first spacers 350 may include, for example, at least one of silicon nitride (SiN), silicon oxynitride (SiON), silicon oxide ($SiO_2$), silicon oxycarbonitride (SiOCN), and a combination thereof.

The third dummy gate electrode DG3 and the fourth dummy gate electrode DG4 may have similar structures to the second gate electrode G2 and the third gate electrode G3, respectively. The third dummy gate electrode DG3 and the fourth dummy gate electrode DG4 may include a first dummy gate insulating film 210, a first dummy work-function metal 220, and a first dummy fill metal 230.

In this case, the first dummy gate insulating film 210 may include the same material as the first gate insulating film 310 and have the same thickness as the first gate insulating film 310. Similarly, the first dummy work-function metal 220 may include the same material as the first work-function metal 320 and have the same thickness as the first work-function metal 320. The first dummy fill metal 230 may include the same material as the first fill metal 330.

However, each of the third dummy gate electrode DG3 and the fourth dummy gate electrode DG4 may be formed on top surfaces of the second fin F2 and the third fin F3 and a top surface of the first field insulating film 200. Accordingly, each of the third dummy gate electrode DG3 and the fourth dummy gate electrode DG4 may have a stepped bottom surface along steps between the first field insulating film 200 and the second fin F2 and the third fin F3. Since the first dummy gate insulating film 210 and the first dummy work-function metal 220 are formed along the stepped bottom surface, the first dummy gate insulating film 210 and the first dummy work-function metal 220 may also have stepped bottom surfaces. In addition, the first dummy fill metal 230, which fills the remaining space, may also have a stepped bottom surface.

A first dummy capping film 240 may be disposed on each of the third dummy gate electrode DG3 and the fourth dummy gate electrode DG4. The first dummy capping film 240 may include the same material as the first capping film 340 and have the same thickness as the first capping film 340.

The first source and drain regions 400 may be disposed to sides of the second gate electrode G2, the third gate electrode G3, the third dummy gate electrode DG3, and the fourth dummy gate electrode DG4. The first source and drain regions 400 may include an epitaxial layer formed using an epitaxial process. Further, the first source and drain regions 400 may be elevated source and drain regions. The first source and drain regions 400 located in the n region Rn may include, for example, a silicon (Si) epitaxial layer or a silicon carbide (SiC) epitaxial layer. In this case, the first source and drain regions 400 may include SiP or SiPC that is heavily doped with phosphorous (P).

The first interlayer insulating film 510 may cover top surfaces of the substrate 100, the first source and drain regions 400, and the first field insulating film 200. The first interlayer insulating film 510 may fill spaces between side surfaces of gate electrodes and dummy gate electrodes. A top surface of the first interlayer insulating film 510 may be coplanar with top surfaces of the first spacers 350, first dummy spacers 250, the first capping film 340, and the first dummy capping film 240.

The second interlayer insulating film 520 may be formed on the first interlayer insulating film 510. Each of the first interlayer insulating film 510 and the second interlayer insulating film 520 may include, for example, at least one of silicon oxide, silicon nitride, silicon oxynitride, and a low-k dielectric material having a lower dielectric constant than silicon oxide.

The first contact 410 may be formed through the first interlayer insulating film 510 and the second interlayer insulating film 520 and in contact with the first source and drain regions 400. The first contact 410 may be formed to a greater depth than the top surfaces of the first source and drain regions 400. A silicide may be formed at an interface between the first contact 410 and the first source and drain regions 400. A barrier metal may be formed on surfaces of the first contact 410 which are in contact with the first interlayer insulating film 510, the second interlayer insulating film 520, and the first source and drain regions 400.

Each of the second gate electrode G2 and the third gate electrode G3 in the p region Rp may include the first gate insulating film 310, the first work-function metal 320, a second work-function metal 325, and the first fill metal 330.

The second work-function metal 325 may be formed on the first work-function metal 320. The second work-function metal 325 may include a p-type work-function control material. The p-type work-function control material may include at least one of TiN, TaN, and TiAlC. However, the present embodiment is not limited thereto. The first fill metal 330 may be formed on the second work-function metal 325.

The second gate electrode G2 and the third gate electrode G3 may be used as a gate electrode of a PMOS transistor in the p region Rp due to the first work-function metal 320, the second work-function metal 325, and the first fill metal 330.

The third diffusion break structure B3 may include two single diffusion break films 600 instead of the third dummy gate electrode DG3 and the fourth dummy gate electrode DG4. Each of the single diffusion break films 600 may be formed in each of a second trench T2 and a third trench T3.

The second trench T2 may be formed to a relatively great depth at a position where the third dummy gate electrode DG3 is located, while the third trench T3 may be formed to a relatively great depth at a position where the fourth dummy gate electrode DG4 is located. Accordingly, the second trench T2 and the third trench T3 may separate the sixth fin F6 and the seventh fin F7 and, simultaneously, define an isolated fin FI. The isolated fin FI may be a portion of the second fin structure Fs2, which is isolated by the two single diffusion break films 600.

The second trench T2 and the third trench T3 formed in the p region Rp may have a smaller width than the first trench T1 formed in the n region Rn. However, the present embodiment is not limited thereto.

Lower side surfaces of the single diffusion break film 600 may be defined by the sixth fin F6, the seventh fin F7, and the isolated fin FI, while upper side surfaces of the single diffusion break film 600 may be defined by the first dummy spacers 250. For example, the first dummy spacers 250 may be located on side surfaces of the single diffusion break film 600.

Since each of the single diffusion break films 600 is located at positions where the existing third dummy gate electrode DG3 and fourth dummy gate electrode DG4 are located, each of the single diffusion break films 600 may have the same first width W1 as the third dummy gate electrode DG3 and the fourth dummy gate DG4. In addition, a top surface of the single diffusion break film 600 may be at the same level as top surfaces of the first capping film 340 and the first interlayer insulating film 510.

The single diffusion break film 600 may include a material capable of applying stress to the second fin structure Fs2. When the single diffusion break film 600 applies stress to a channel of a transistor formed in the second fin structure Fs2, the mobility of holes serving as carriers may be improved.

The second source and drain regions 401 may be disposed to sides of the second gate electrode G2 and the third gate electrode G3. Further, dummy source and drain regions 402 may be disposed on the isolated fin FI between the single diffusion break films 600.

The second source and drain regions 401 and the dummy source and drain regions 402 may include an epitaxial layer formed using an epitaxial process. Further, the second source and drain regions 401 and the dummy source and drain regions 402 may be elevated source and drain regions. The second source and drain regions 401 and the dummy source and drain regions 402 located in the p region Rp may include, for example, a SiGe epitaxial layer.

Outer circumferential surfaces of the first source and drain regions 400, the second source and drain regions 401, and the dummy source and drain regions 402 may have at least one of a diamond shape, a circular shape, and a rectangular shape. In FIG. 4A, a diamond shape (or a pentagonal or hexagonal shape) is illustrated as an example.

A process of forming the single diffusion break film 600 may be performed after a process of forming the second source and drain regions 401 and the dummy source and drain regions 402. Accordingly, the dummy source and drain regions 402 may be formed to a side of each of the single diffusion break films 600.

In the semiconductor device according to some exemplary embodiments of the present disclosure, a process of forming the single diffusion break film 600 may be performed before the second source and drain regions 401 and the dummy source and drain regions 402 are formed. In this case, the dummy source and drain regions 402 may not be separately formed on the isolated fin FI.

The second contact 411 may be formed through the first interlayer insulating film 510 and the second interlayer insulating film 520 and formed in contact with the second source and drain regions 401. The second contact 411 may be formed to have a greater depth than top surfaces of the second source and drain regions 401. A silicide may be formed at an interface between the second contact 411 and the second source and drain regions 401. A barrier metal may be formed on surfaces of the second contact 411, which are in contact with the first interlayer insulating film 510, the second interlayer insulating film 520, and the second source and drain regions 401.

Referring to FIGS. 4A and 5A, a first groove Gr1 and a second groove Gr2 may be disposed to sides of the third fin F3 in a second direction Y. The first groove Gr1 and the second groove Gr2 may be traces obtained by forming particular fins together with the third fin F3 and then cutting partial of the particular fins. Similarly, a third groove Gr3 and a fourth groove Gr4 may be disposed to sides of the seventh fin F7 in the second direction Y. Although FIG. 4A illustrates an example in which one groove is disposed in each of both sides of the third fin F3 and the seventh fin F7, the present embodiment is not limited thereto.

In the semiconductor device according to the present embodiment, a transistor may be implemented using only one fin in each of the n region Rn and the p region Rp. A single fin structure of the semiconductor device may have lower power consumption and higher integration density than a structure using a plurality of fins.

Furthermore, the semiconductor device according to the present embodiment may obtain a relatively wide space margin in an upper contact and an interconnection structure, thereby greatly improving operating reliability of the semiconductor device.

A conventional structure using a plurality of fins may have a more stable distribution in threshold voltage than a single fin structure. A distribution in threshold voltage may affect PMOS transistors having high threshold voltages more significantly. When a double diffusion break film structure is used, the distribution in threshold voltage may be more problematic. That is due to the fact that, as compared to a single diffusion break film structure, the double diffusion break film structure has a layout effect, which causes a rise in threshold voltage of a gate electrode.

However, in the semiconductor device according to the present embodiment, two single diffusion break films may be formed instead of a double diffusion break film in the p region Rp in which a PMOS transistor is formed. Thus, a threshold voltage of the PMOS transistor may be stably controlled so that the semiconductor device may have high reliability and improved operating performance.

Hereinafter, a semiconductor device according to some exemplary embodiments of the present disclosure will be described with reference to FIGS. 1, 4B, and 5B. The description of components of the present exemplary embodiment which are the same as those of the above-described exemplary embodiment will be omitted or briefly described.

Figure 4B:
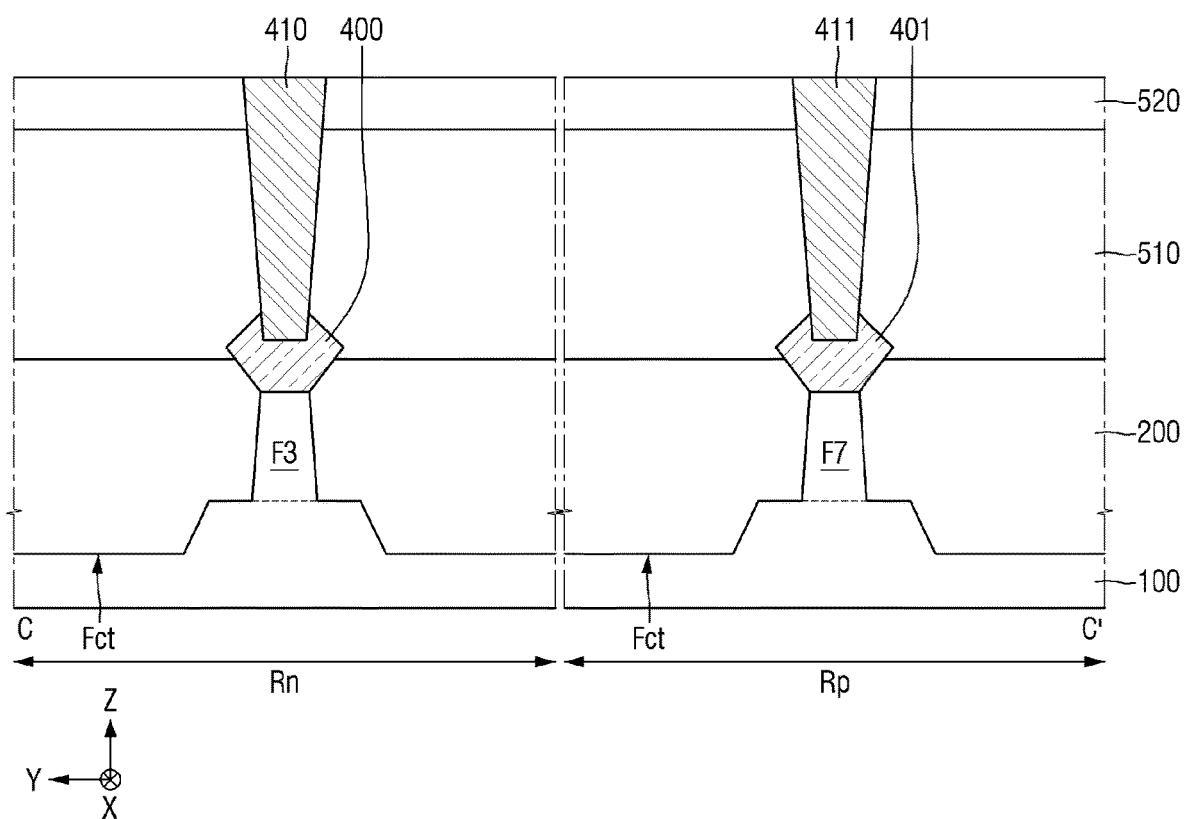
FIG. 4B is a cross-sectional view for illustrating a semiconductor device according to some exemplary embodiments of the present disclosure.

FIG. 4B is a cross-sectional view for illustrating a semiconductor device according to some exemplary embodiments of the present disclosure. FIG. 5B is a cross-sectional view for illustrating a semiconductor device according to some exemplary embodiments of the present disclosure. FIG. 4B is a cross-sectional view taken along line C-C' of FIG. 1, and FIG. 5B is a cross-sectional view taken along line D-D' of FIG. 1.

Figure 5B:
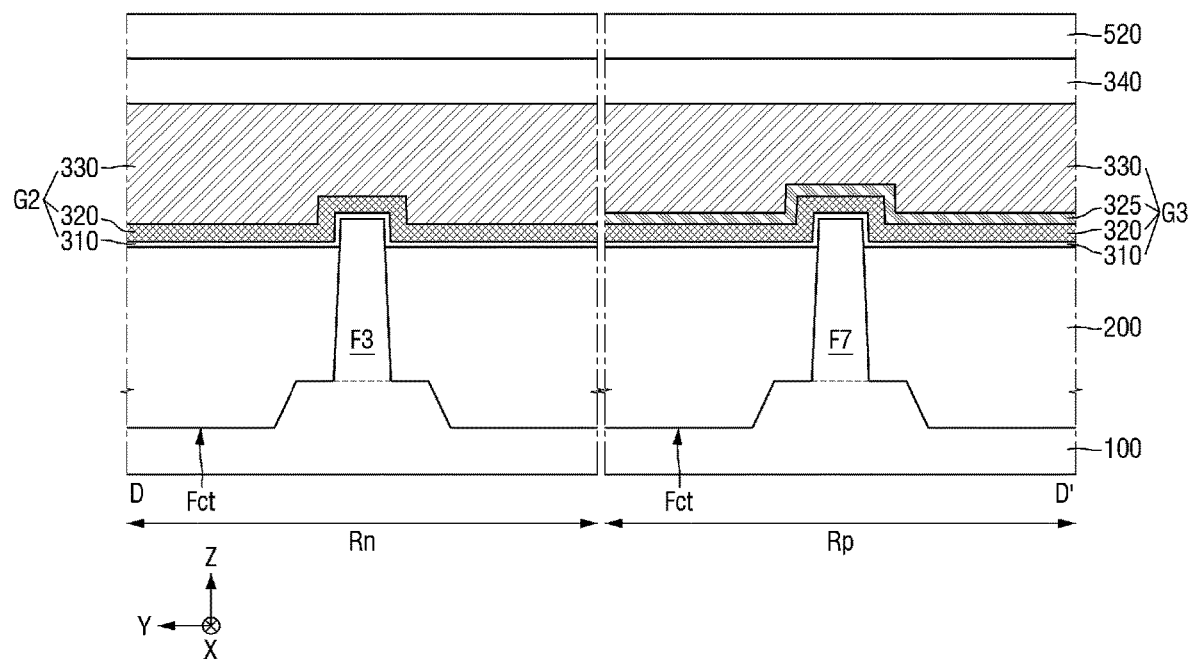
FIG. 5B is a cross-sectional view for illustrating a semiconductor device according to some exemplary embodiments of the present disclosure.

Referring to FIGS. 1, 4B, and 5B, fin cut trenches Fct may be disposed on both sides of a third fin F3 and a seventh fin F7. The fin cut trenches Fct may have bottom surfaces located at a lower level than a top surface of a substrate 100. Unlike the grooves of FIGS. 4A and 5A, the fin cut trenches Fct may be traces obtained by deeply removing fins. Although positions of the fin cut trenches Fct are illustrated on both sides of the third fin F3 and the seventh fin F7 for brevity, the present embodiment is not limited thereto.

Hereinafter, a semiconductor device according to some exemplary embodiments of the present disclosure will be described with reference to FIGS. 6 and 7. The description of components of the present exemplary embodiment which are the same as those of the above-described exemplary embodiment will be omitted or briefly described.

Figure 6:
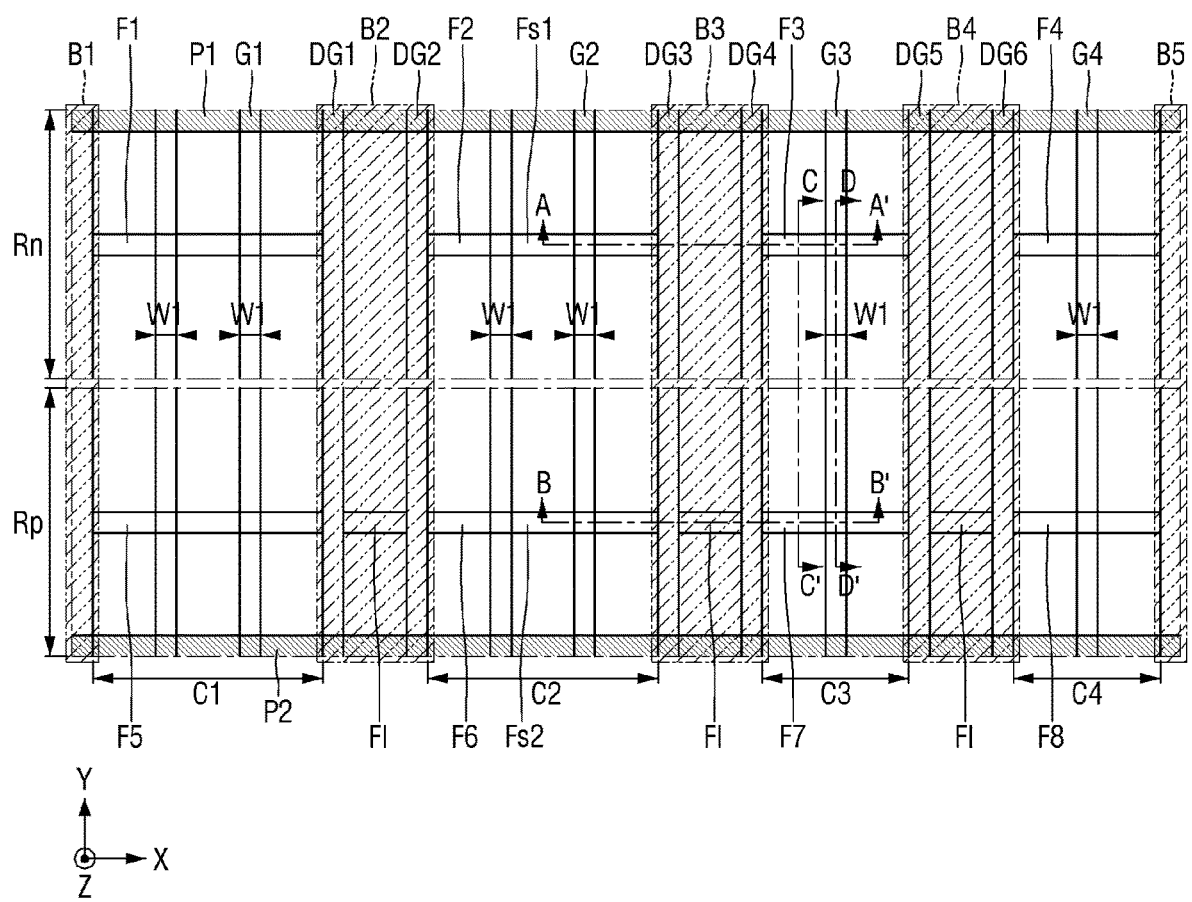
FIG. 6 is a layout diagram for illustrating a semiconductor device according to some exemplary embodiments of the present disclosure.
Figure 7:
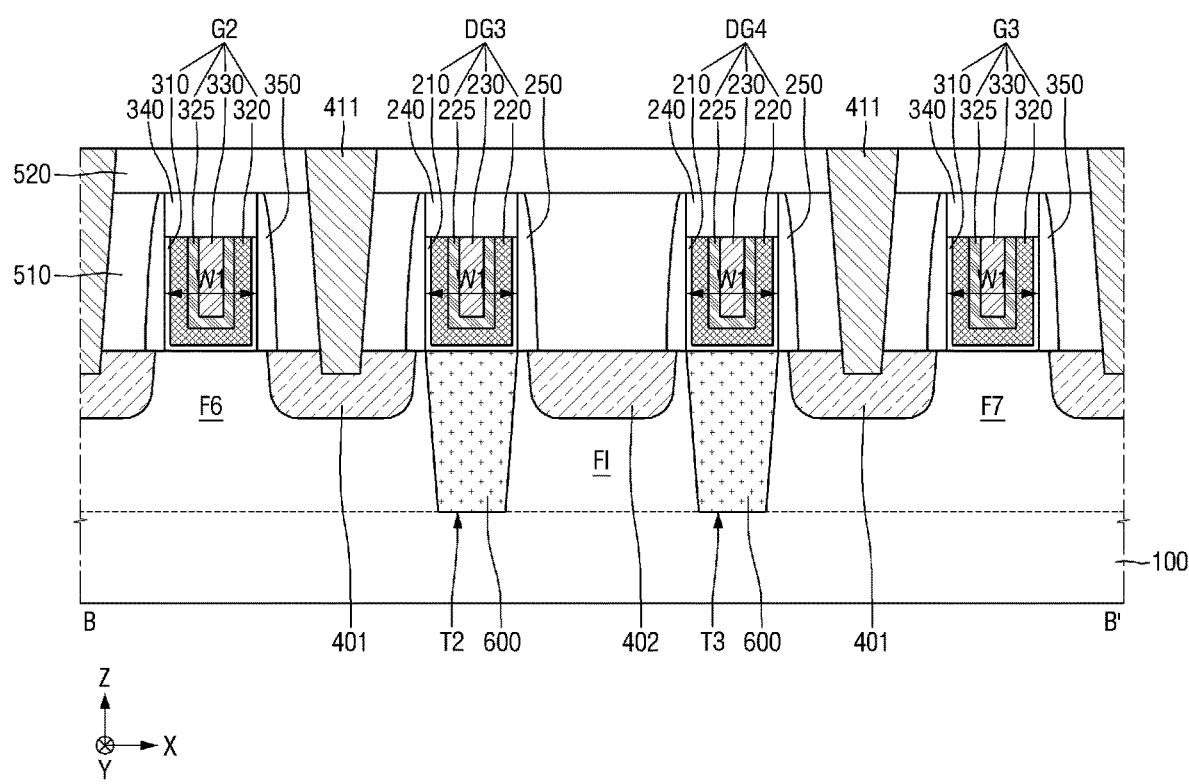
FIG. 7 is a cross-sectional view taken along line B-B' of FIG. 14.

FIG. 6 is a layout diagram for illustrating a semiconductor device according to some exemplary embodiments of the present disclosure, and FIG. 7 is a cross-sectional view taken along line B-B' of FIG. 6.

Referring to FIGS. 6 and 7, in the semiconductor device according to some exemplary embodiments of the present disclosure, a dummy gate electrode may be formed on a single diffusion break film 600. For example, a third dummy gate electrode DG3 and a fourth dummy gate electrode DG4 may be formed not only in an n region Rn but also in a p region Rp. That is due to the fact that after the single diffusion break film 600 is formed, gate electrodes G2 and G3 and the third and fourth dummy gate electrodes DG3 and DG4 are formed.

A cross-sectional view taken along line A-A' of FIG. 6 may be the same as FIG. 2.

Hereinafter, a semiconductor device according to some exemplary embodiments of the present disclosure will be described with reference to FIGS. 8 and 9. The description of components of the present exemplary embodiment which are the same as those of the above-described exemplary embodiment will be omitted or briefly described.

Figure 8:
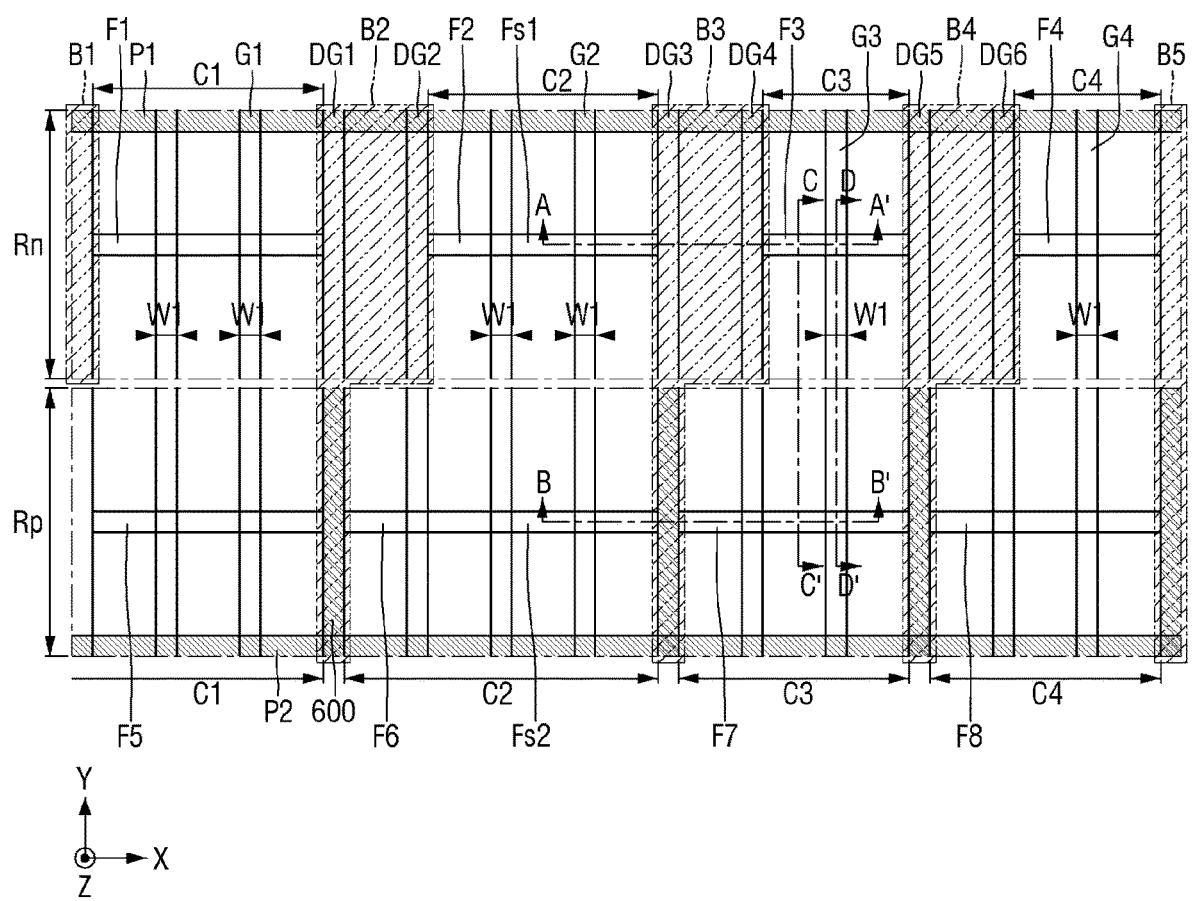
FIG. 8 is a layout diagram for illustrating a semiconductor device according to some exemplary embodiments of the present disclosure.
Figure 9:
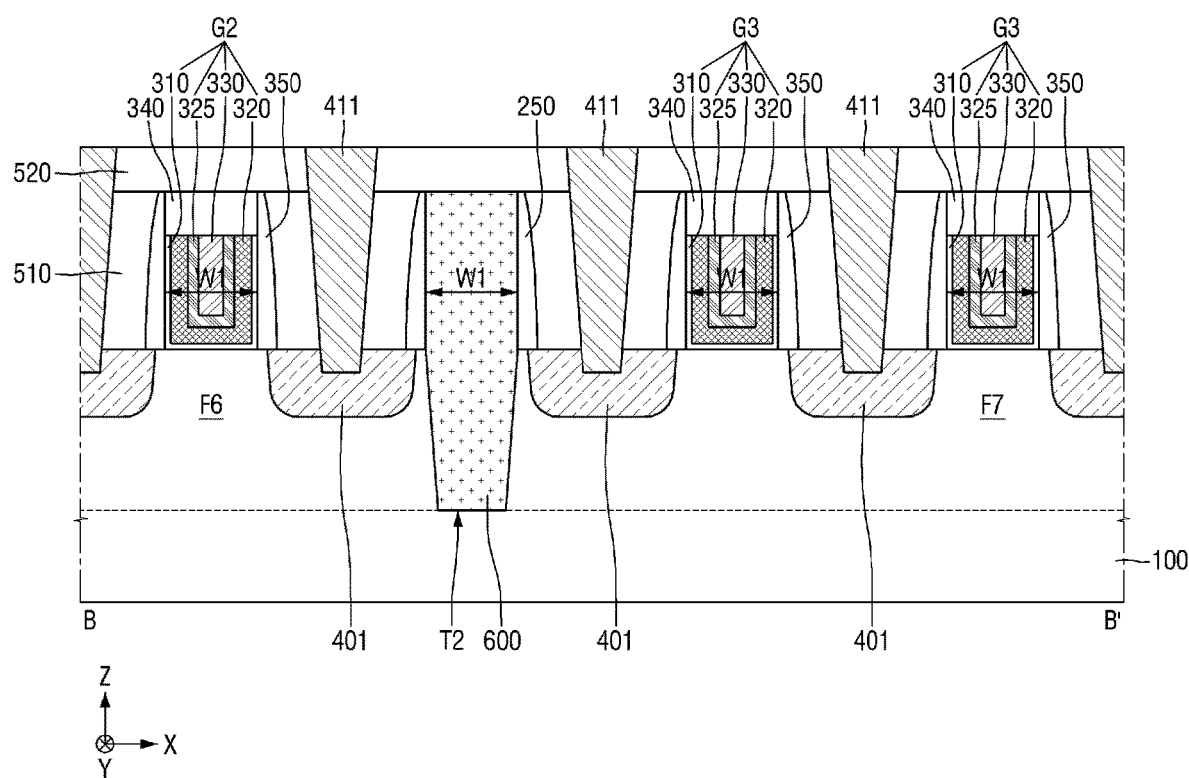
FIG. 9 is a cross-sectional view taken along line B-B' of FIG. 8.

FIG. 8 is a layout diagram for illustrating a semiconductor device according to some exemplary embodiments of the present disclosure, and FIG. 9 is a cross-sectional view taken along line B-B' of FIG. 8.

Referring to FIGS. 8 and 9, the semiconductor device according to some exemplary embodiments of the present disclosure may include a double diffusion break film in an n region Rn and include a single diffusion break film in a p region Rp.

In example embodiments, each of first to fourth cells C1 to C4 may have a p region Rp that is wider than an n region Rn. For example, an n region Rn of a third diffusion break structure B3 may include both a third dummy gate electrode DG3 and a fourth dummy gate electrode DG4. By contrast, a p region Rp of the third diffusion break structure B3 may include only a single diffusion break film 600, which extends from the third dummy gate electrode DG3 in a second direction Y, and a third gate electrode G3 may be formed to extend from the fourth dummy gate electrode DG4 in the second direction Y and operate as a third cell C3. In this case, the third cell C3 may have two third gate electrode electrodes G3. Naturally, the fourth dummy gate electrode DG4 may continuously extend in the second direction Y in the n region Rn so that a dummy gate electrode may be formed even in the p region Rp.

A cross-sectional view taken along line A-A' of FIG. 8 may be the same as FIG. 2.

The present embodiment may stably control a threshold voltage by using the single diffusion break film 600 instead of the double diffusion break film in the p region Rp. Further, a wide space margin may be obtained in the p region Rp, thereby improving operating characteristics of the semiconductor device.

Hereinafter, a semiconductor device according to some exemplary embodiments of the present disclosure will be described with reference to FIGS. 10 and 11. The description of components of the present exemplary embodiment which are the same as those of the above-described exemplary embodiment will be omitted or briefly described.

Figure 10:
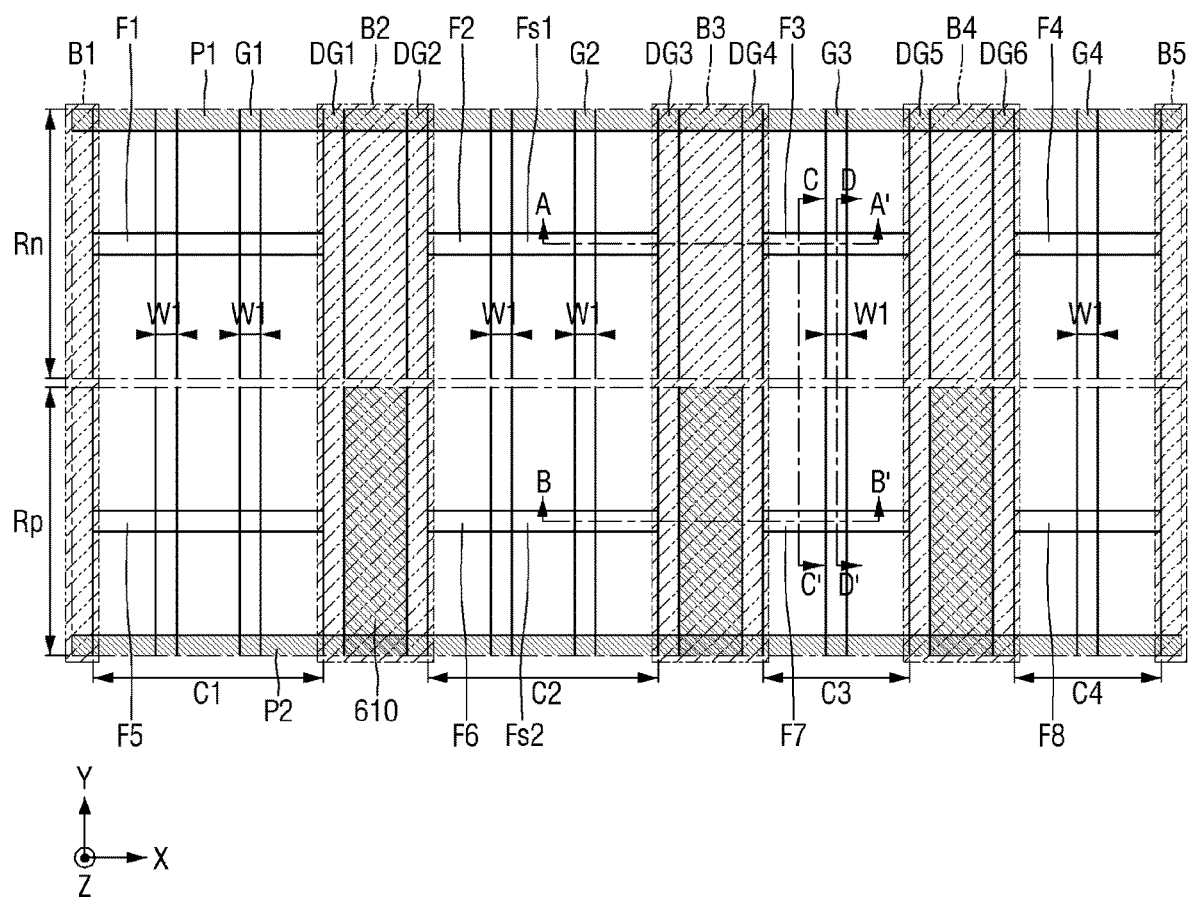
FIG. 10 is a layout diagram for illustrating a semiconductor device according to some exemplary embodiments of the present disclosure.
Figure 11:
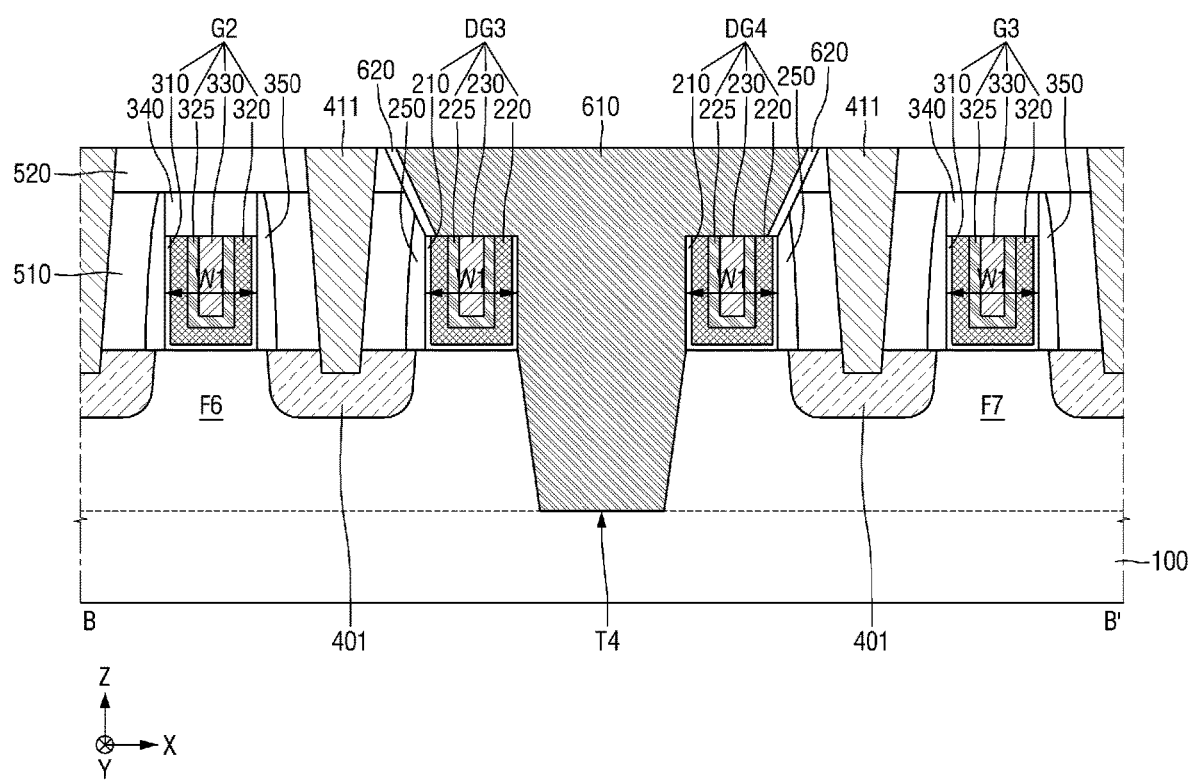
FIG. 11 is a cross-sectional view taken along line B-B' of FIG. 10.

FIG. 10 is a layout diagram for illustrating a semiconductor device according to some exemplary embodiments of the present disclosure, and FIG. 11 is a cross-sectional view taken along line B-B' of FIG. 10.

Referring to FIGS. 10 and 11, in a semiconductor device according to some exemplary embodiments of the present disclosure, a diffusion break film 610 may be disposed between dummy gate electrodes in a p region Rp.

Specifically, a fourth trench T4 may be formed between a third dummy gate electrode DG3 and a fourth dummy gate electrode DG4. The fourth trench T4 may space a sixth fin F6 and a seventh fin F7 apart from each other in a first direction X. A lower portion of the fourth trench T4 may be defined by side surfaces of the sixth fin F6 and the seventh fin F7 in the first direction X. A middle portion of the fourth trench T4 may be defined by side surfaces of the third dummy gate electrode DG3 and the fourth dummy gate electrode DG4. An upper portion of the fourth trench T4 may be defined by a first interlayer insulating film 510 and a second interlayer insulating film 520.

An insulating liner 620 may be formed along a sidewall of the fourth trench T4 which is defined by the first interlayer insulating film 510 and the second interlayer insulating film 520. The insulating liner 620 may be formed along the entire sidewall of the fourth trench T4, and a portion of the insulating liner 620 may be removed so that only a portion of the insulating liner 620 may remain. Accordingly, the insulating liner 620 may also remain on another sidewall of the fourth trench T4. Alternatively, the insulating liner 620 may be completely removed using an etching process and be absent.

The diffusion break film 610 may completely fill the fourth trench T4. Although the diffusion break film 610 is illustrated as a single film, the diffusion break film 610 may have a structure in which a plurality of films are stacked.

In the present embodiment, dummy gate electrodes may be formed in both a p region Rp and an n region Rn, and the diffusion break film 610 may then be formed only in the p region Rp. For example, a cross-sectional view taken along line A-A' of FIG. 10 may be the same as FIG. 2. Thus, processes may be relatively simple. Accordingly, a semiconductor device having relatively high reliability may be provided.

Hereinafter, a semiconductor device according to some exemplary embodiments of the present disclosure will be described with reference to FIGS. 12 and 13. The description of components of the present exemplary embodiment which are the same as those of the above-described exemplary embodiment will be omitted or briefly described.

Figure 12:
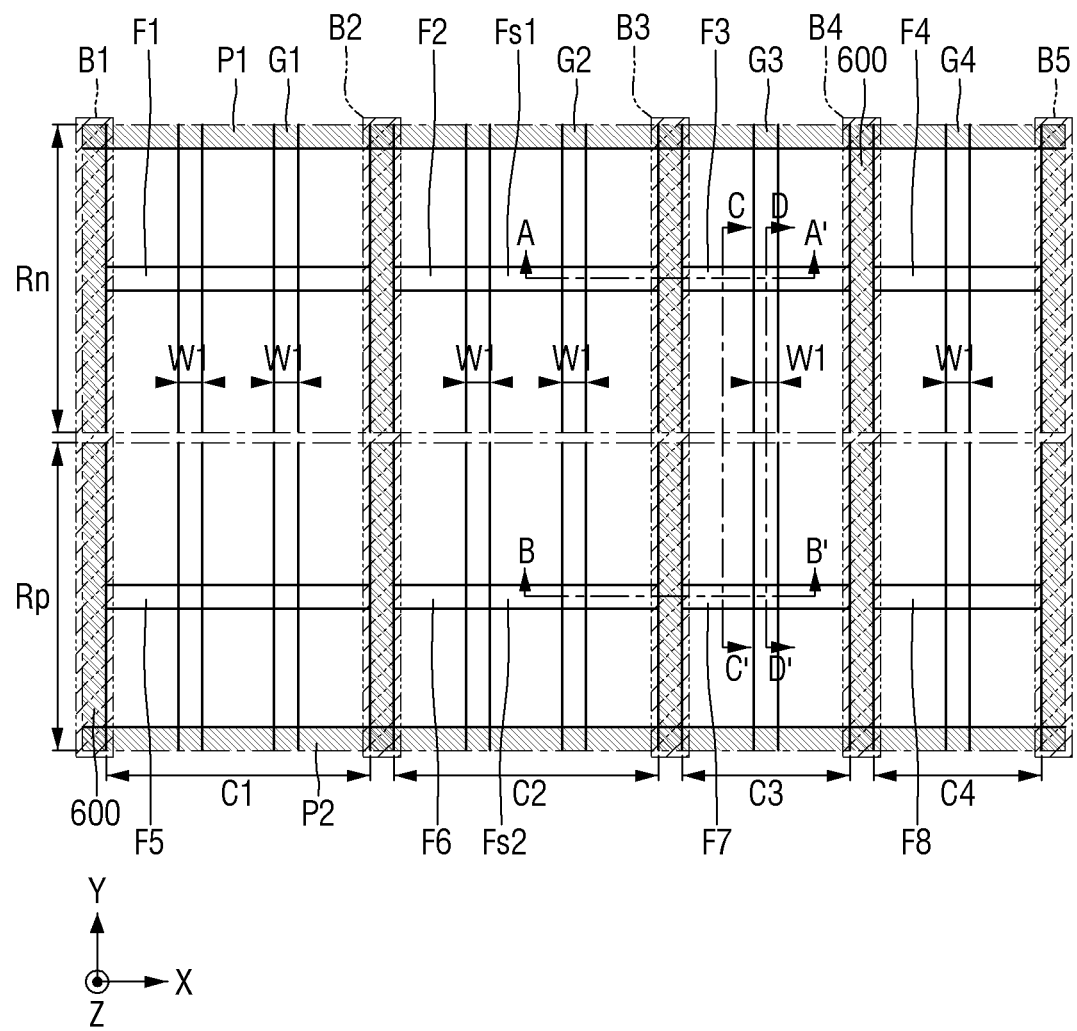
FIG. 12 is a layout diagram for illustrating a semiconductor device according to some exemplary embodiments of the present disclosure.
Figure 13:
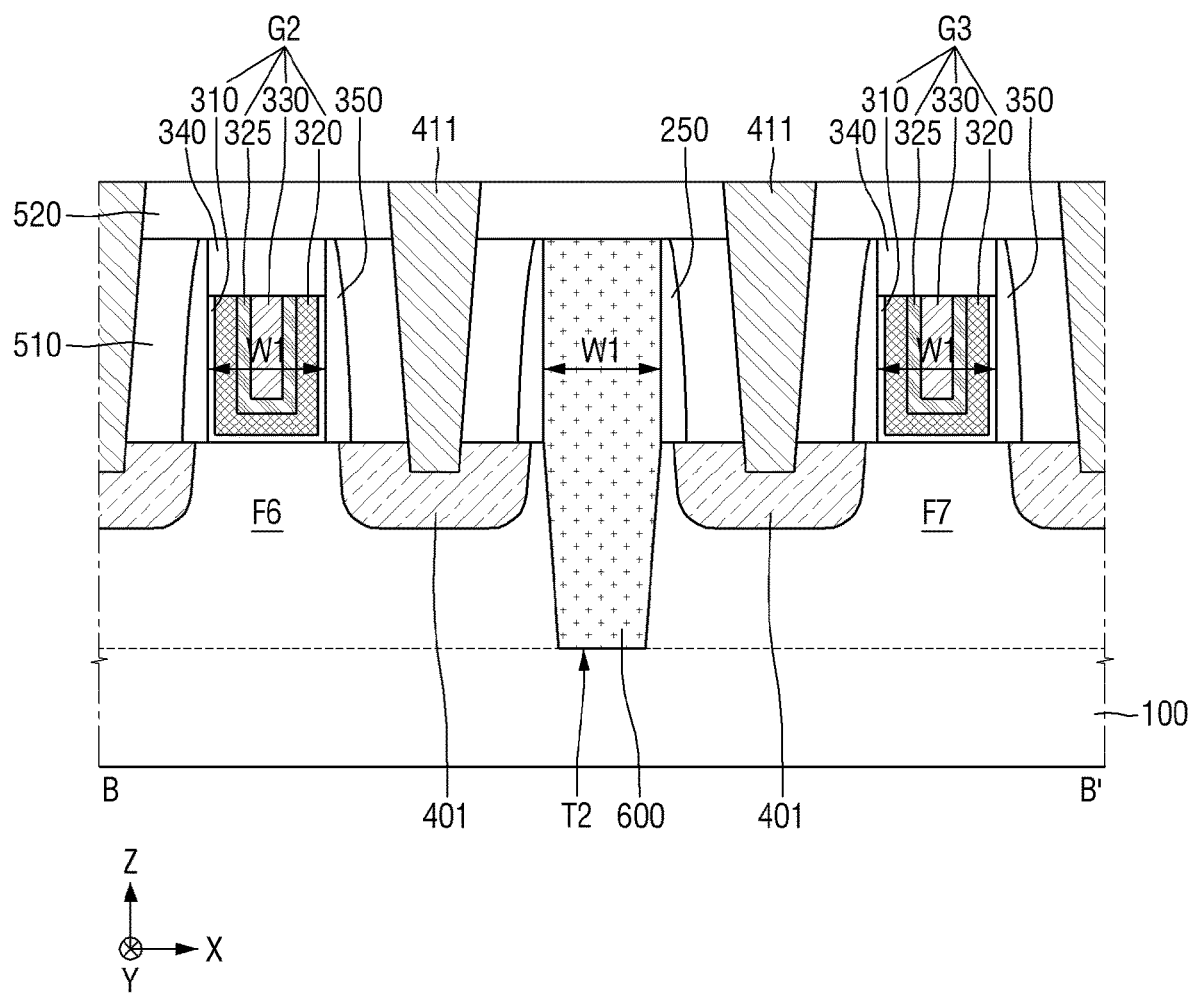
FIG. 13 is a cross-sectional view taken along line B-B' of FIG. 12.

FIG. 12 is a layout diagram for illustrating a semiconductor device according to some exemplary embodiments of the present disclosure, and FIG. 13 is a cross-sectional view taken along line B-B' of FIG. 12.

Referring to FIGS. 12 and 13, in the semiconductor device according to some exemplary embodiments of the present disclosure, first to fifth diffusion break structures B1 to B5 may include a single diffusion break film 600 not only in a p region Rp but also in an n region Rn. Further, only one single diffusion break film 600 in each of the fifth diffusion break structures B1 to B5, not two single diffusion break films, may extend in a second direction Y.

In the present embodiment, since only one single diffusion break film 600 in each of the fifth diffusion break structures B1 to B5 is formed, the integration density of the semiconductor device may be improved. Furthermore, a threshold voltage of a transistor may be stably controlled by reducing a layout effect.

Hereinafter, a semiconductor device according to some exemplary embodiments of the present disclosure will be described with reference to FIGS. 1, 14, and 15. The description of components of the present exemplary embodiment which are the same as those of the above-described exemplary embodiment will be omitted or briefly described.

Figure 14:
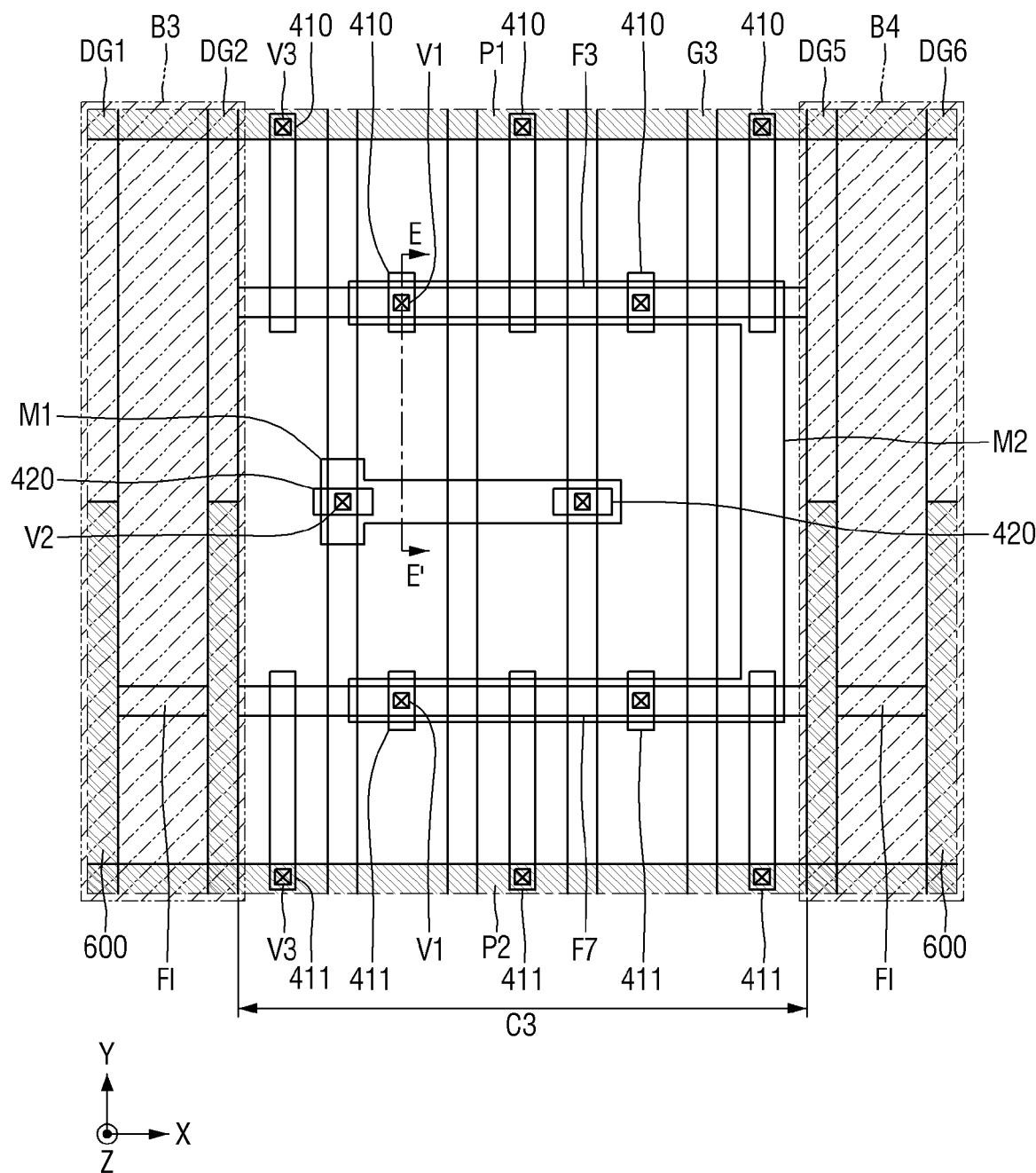
FIG. 14 is a layout diagram for illustrating a semiconductor device according to some exemplary embodiments of the present disclosure.
Figure 15:
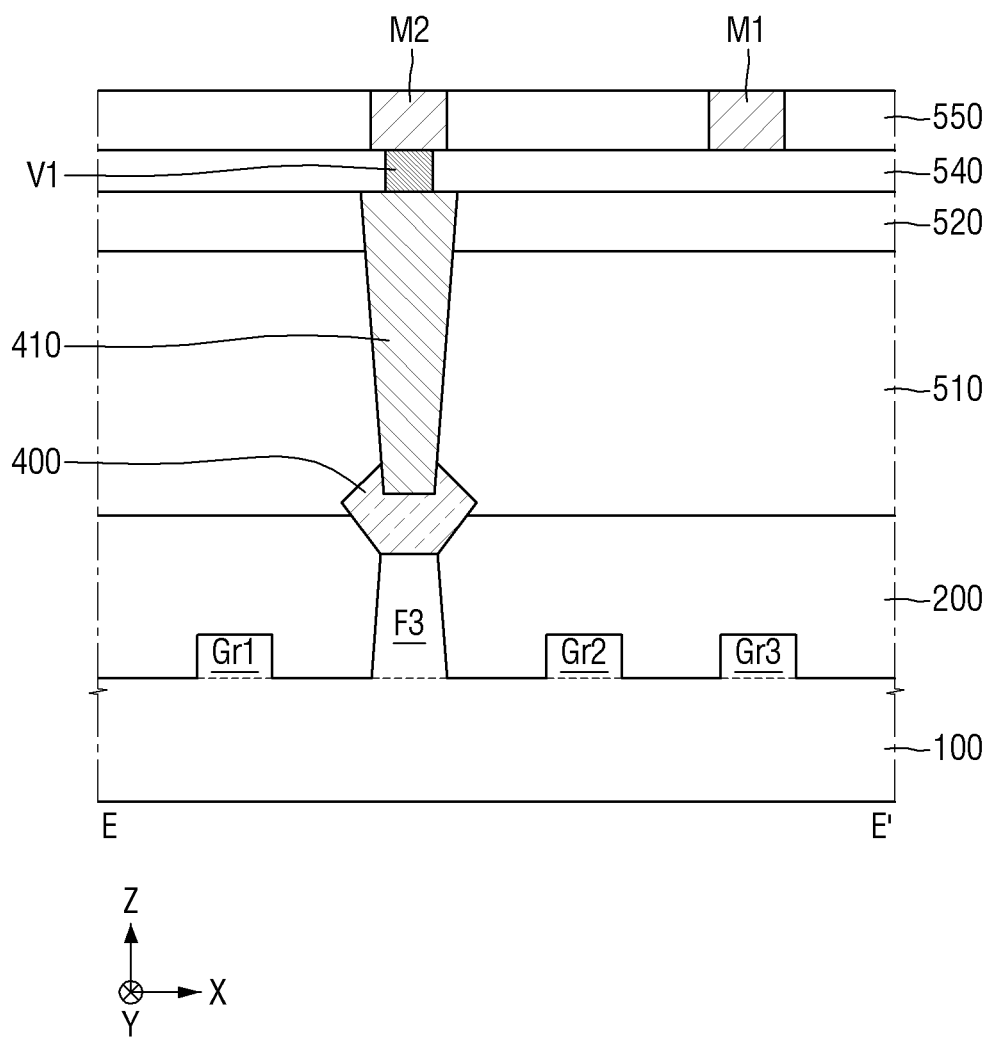
FIG. 15 is a cross-sectional view taken along line E-E' of FIG. 14.

FIG. 14 is a layout diagram for illustrating a semiconductor device according to some exemplary embodiments of the present disclosure, and FIG. 15 is a cross-sectional view taken along line E-E' of FIG. 14.

Referring to FIGS. 1, 14, and 15, in the semiconductor device according to some exemplary embodiments of the present disclosure, a third cell C3 may include four third gate electrodes G3. A portion of a first contact 410 may be electrically connected to a first power rail P1 through a third via V3. For example, a ground voltage GND may be provided to the first power rail P1. The first power rail P1 may be electrically connected to an epitaxial layer heavily doped with P-type impurities. As an example, the first power rail P1 may be electrically connected to the portion of the first contact 410 through the third via V3. A portion of the first contact 410 may be connected to a second interconnecting wire M2 through a first via V1.

Similarly, a portion of a second contact 411 may be electrically connected to a second power rail P2 through the third via V3. For example, a power supply voltage VCC or VDD may be provided to the second power rail P2. The second power rail P2 may be electrically connected to an epitaxial layer heavily doped with N-type impurities. As an example, the second power rail P2 may be electrically connected to the portion of the first contact 410 through the third via V3. A portion of the second contact 411 may be connected to the second interconnecting wire M2 through the first via V1.

A gate contact 420 may be formed on the third gate electrode G3 and connected to a first interconnecting wire M1 through a second via V2.

A third interlayer insulating film 540 may be formed on a second interlayer insulating film 520, and a fourth interlayer insulating film 550 may be formed on the third interlayer insulating film 540. The first to third vias V1 to V3 may be formed through the third interlayer insulating film 540, and the first interconnecting wire M1, the second interconnecting wire M2, the first power rail P1, and the second power rail P2 may be formed in the fourth interlayer insulating film 550.

The first interconnecting wire M1, the second interconnecting wire M2, the first power rail P1, and the second power rail P2 may all be formed at the same level. The first to third vias V1 to V3 may also be formed at the same level under the first interconnecting wire M1, the second interconnecting wire M2, the first power rail P1, and the second power rail P2.

The first contact 410, the second contact 411, and the gate contact 420 may be formed at the same level under the first to third vias V1 to V3. However, the present embodiment is not limited thereto.

Shapes of the first contact 410, the second contact 411, the gate contact 420, the first interconnecting wire M1, and the second interconnecting wire M2 may not necessarily be the same as shown in the drawings, but may be changed as needed.

Hereinafter, a semiconductor device according to some exemplary embodiments of the present disclosure will be described with reference to FIGS. 1 and 16. The description of components of the present exemplary embodiment which are the same as those of the above-described exemplary embodiment will be omitted or briefly described.

Figure 16:
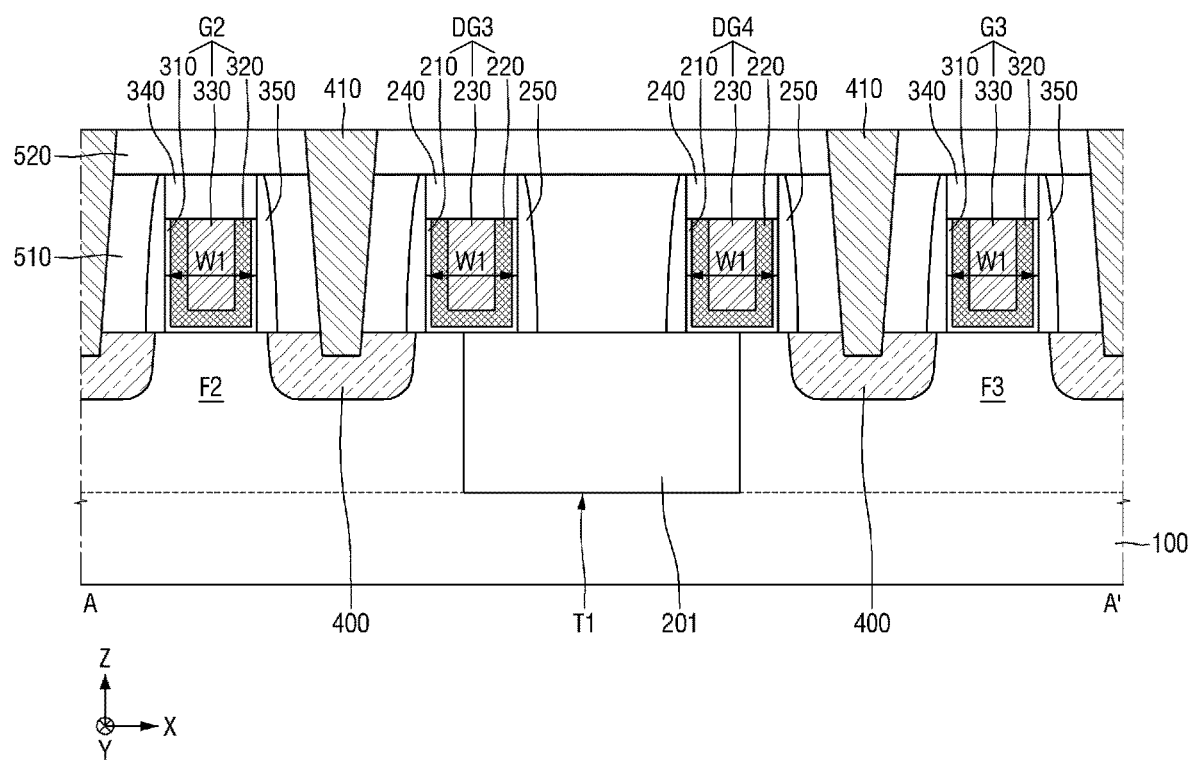
FIG. 16 is a cross-sectional view for illustrating a semiconductor device according to some exemplary embodiments of the present disclosure.

FIG. 16 is a cross-sectional view for illustrating a semiconductor device according to some exemplary embodiments of the present disclosure. FIG. 16 is a cross-sectional view taken along line A-A' of FIG. 1.

Referring to FIGS. 1 and 16, a top surface of a second field insulating film 201 may be at the same level as top surfaces of a second fin F2 and a third fin F3. Accordingly, bottom surfaces of a third dummy gate DG3 and a fourth dummy gate DG4 may also be planarly formed without steps. Bottom surfaces of a first dummy gate insulating film 210, a first dummy work-function metal 220, and a first dummy fill metal 230 in the third dummy gate DG3 and the fourth dummy gate DG4 may also be planarly formed.

Hereinafter, a semiconductor device according to some exemplary embodiments of the present disclosure will be described with reference to FIG. 17. The description of components of the present exemplary embodiment which are the same as those of the above-described exemplary embodiment will be omitted or briefly described.

Figure 17:
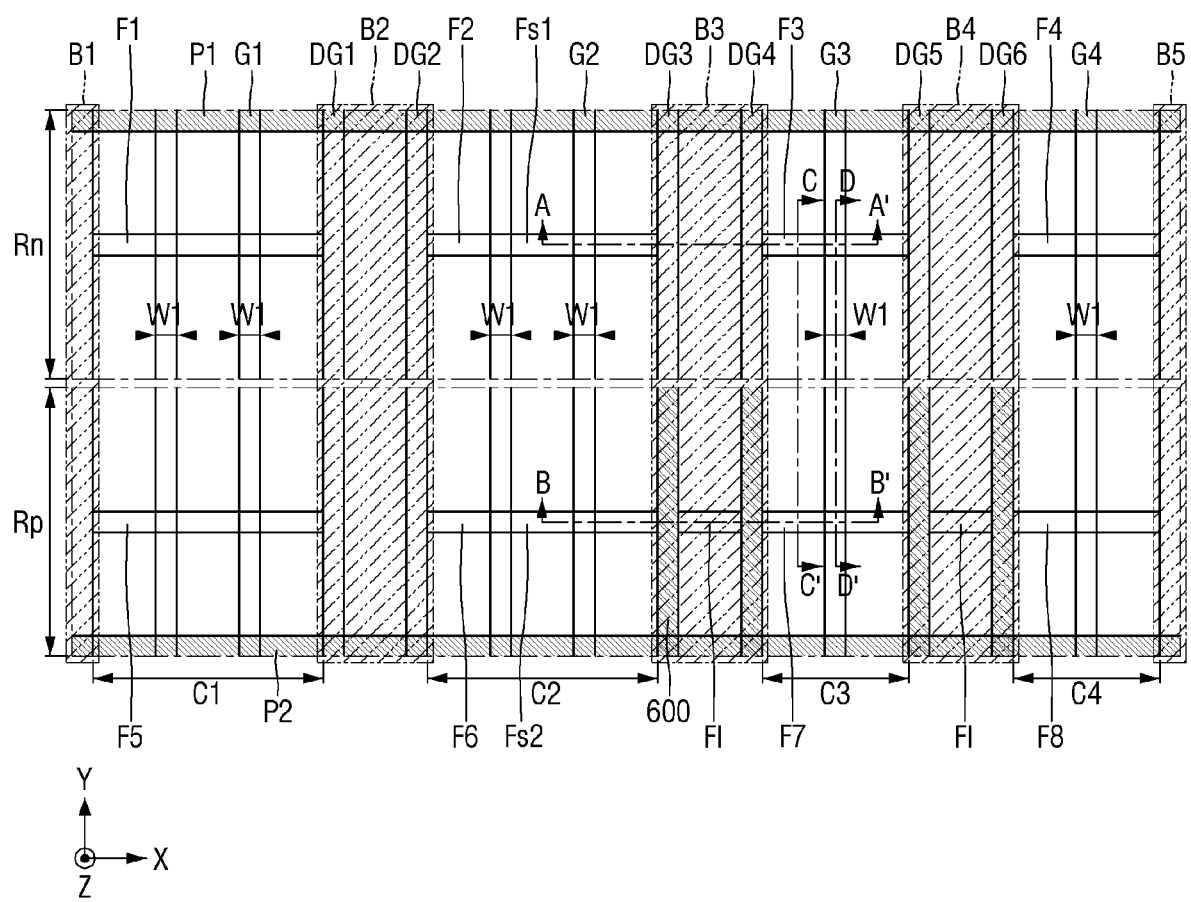
FIG. 17 is a layout diagram for illustrating a semiconductor device according to some exemplary embodiments of the present disclosure.

FIG. 17 is a layout diagram for illustrating a semiconductor device according to some exemplary embodiments of the present disclosure.

Referring to FIG. 17, from among first to fifth diffusion break structures B1 to B5, a third diffusion break structure B3 and a fourth diffusion break structure B4 configured to define a third cell C3 may have an MDB film structure, while the remaining first diffusion break structure B1, second diffusion break structure B2, and fifth diffusion break structure B5 may simply have a double diffusion break film structure.

For example, the above-described layout effect may be even clearer as a distance between a gate electrode and a diffusion break structure becomes closer. Accordingly, only the third cell C3 to which the layout effect may be clearly applied may adopt an MDB film structure so that a p region Rp may have not a double diffusion break film structure but a single diffusion break film structure.

Therefore, in the semiconductor device according to the present embodiment, the difficulty of a process of forming other cells may be reduced, and reliability of other regions may be increased, thereby improving operating characteristics of the entire device and, simultaneously, enabling stable control of a distribution of a threshold voltage of the third cell C3.

Hereinafter, a semiconductor device according to some exemplary embodiments of the present disclosure will be described with reference to FIGS. 18 and 19. The description of components of the present exemplary embodiment which are the same as those of the above-described exemplary embodiment will be omitted or briefly described.

Figure 18:
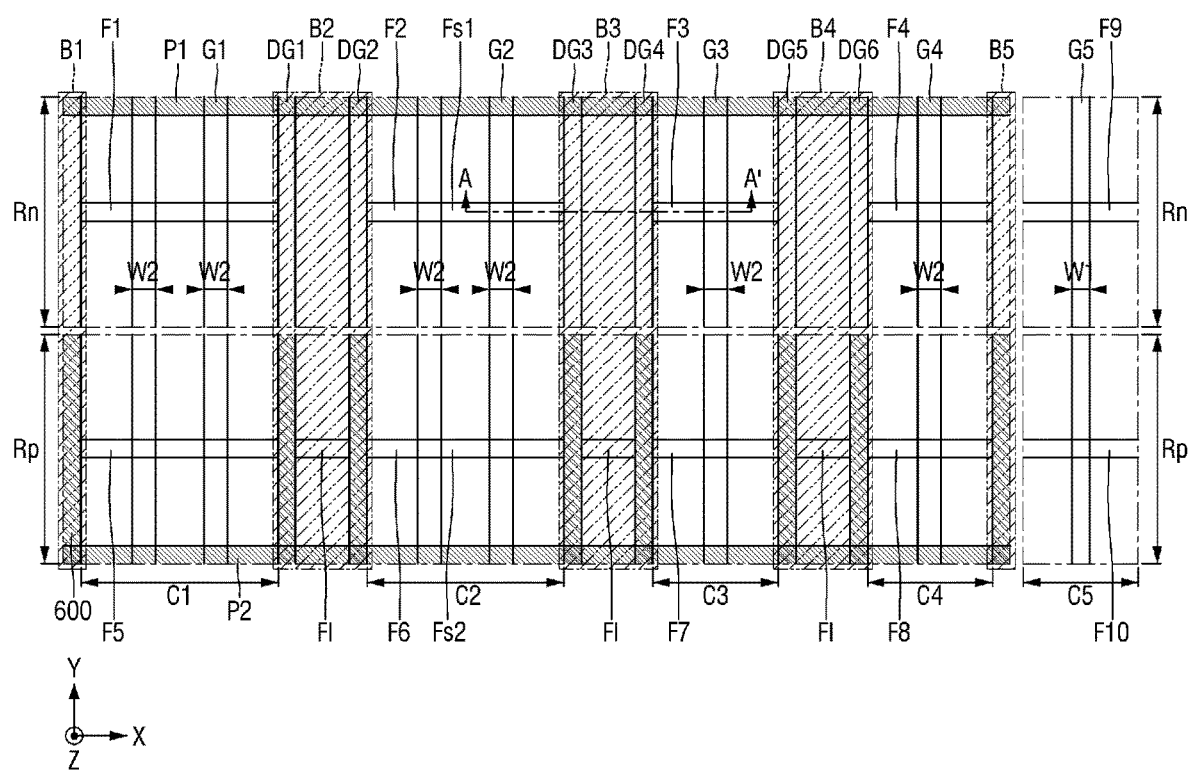
FIG. 18 is a layout diagram for illustrating a semiconductor device according to some exemplary embodiments of the present disclosure.
Figure 19:
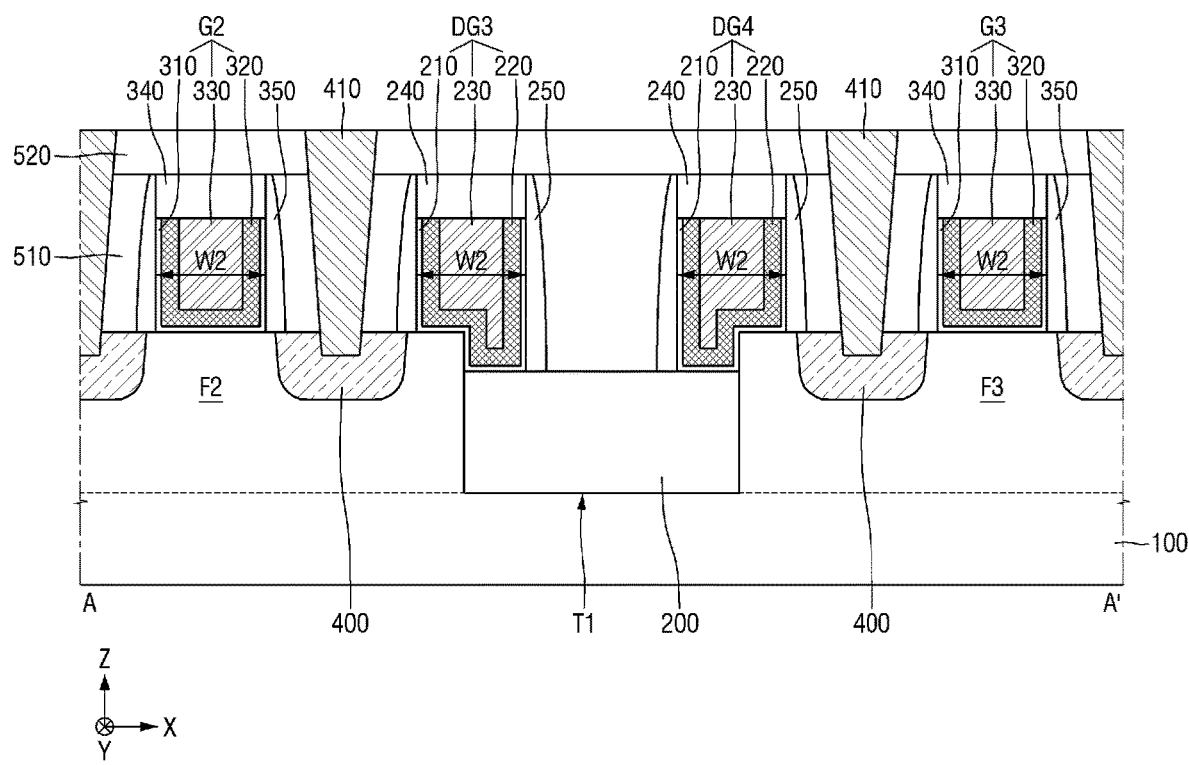
FIG. 19 is a cross-sectional view taken along line A-A' of FIG. 18.

FIG. 18 is a layout diagram for illustrating a semiconductor device according to some exemplary embodiments of the present disclosure, and FIG. 19 is a cross-sectional view taken along line A-A' of FIG. 18.

Referring to FIGS. 18 and 19, the semiconductor device according to some exemplary embodiments of the present disclosure may further include a fifth cell C5.

The fifth cell C5 may be a cell that is adjacent to or spaced apart from first to fourth cells C1 to C4. The fifth cell C5 may be included in an n region Rn and a p region Rp like the first to fourth cells C1 to C4. A ninth fin F9 and a tenth fin F10 may be disposed in the fifth cell C5. The ninth fin F9 may extend in an n region Rn in a first direction X, and the tenth fin F10 may extend in a p region Rp in the first direction X. The ninth fin F9 and the tenth fin F10 may be spaced apart from each other in a second direction Y.

A fifth gate electrode G5 may extend in the second direction Y to cross the ninth fin F9 and the tenth fin F10 on the ninth fin F9 and the tenth fin F10.

In this case, the fifth gate electrode G5 may have a first width W1 in the first direction X, and first to fourth gate electrodes G1 to G4 of the first to fourth cells C1 to C4 may have a second width W2 in the first direction X. The second width W2 may be different from the first width W1. For example, the second width W2 may be greater than the first width W1.

In this case, all dummy gate electrodes including a third dummy gate electrode DG3 and a fourth dummy gate electrode DG4 and a single diffusion break film 600 may have the second width W2. That is due to the fact that the dummy gate electrodes and the single diffusion break film 600 are determined using the same process as a process of patterning gate electrodes.

However, in the semiconductor device according to some exemplary embodiments of the present disclosure, widths of only gate electrodes, excluding the dummy gate electrodes and the single diffusion break film, may be controlled.

In the semiconductor device according to the present embodiment, widths of all gate electrodes of the first to fourth cells C1 to C4 may be controlled, thereby controlling threshold voltages and distributions thereof. For example, by controlling a width of a gate electrode in the first direction X, a channel length of the gate electrode may be controlled so that a threshold voltage of the gate electrode may be controlled.

Since a distribution of threshold voltage is reduced with an increase in the width of the gate electrode, the distribution of threshold voltage may be reduced by controlling the width of the gate electrode.

Accordingly, even if the semiconductor device according to the present embodiment adopts a single fin structure, a transistor having a stable distribution of threshold voltage may be implemented.

Hereinafter, a semiconductor device according to some exemplary embodiments of the present disclosure will be described with reference to FIGS. 20 and 21. The description of components of the present exemplary embodiment which are the same as those of the above-described exemplary embodiment will be omitted or briefly described.

Figure 20:
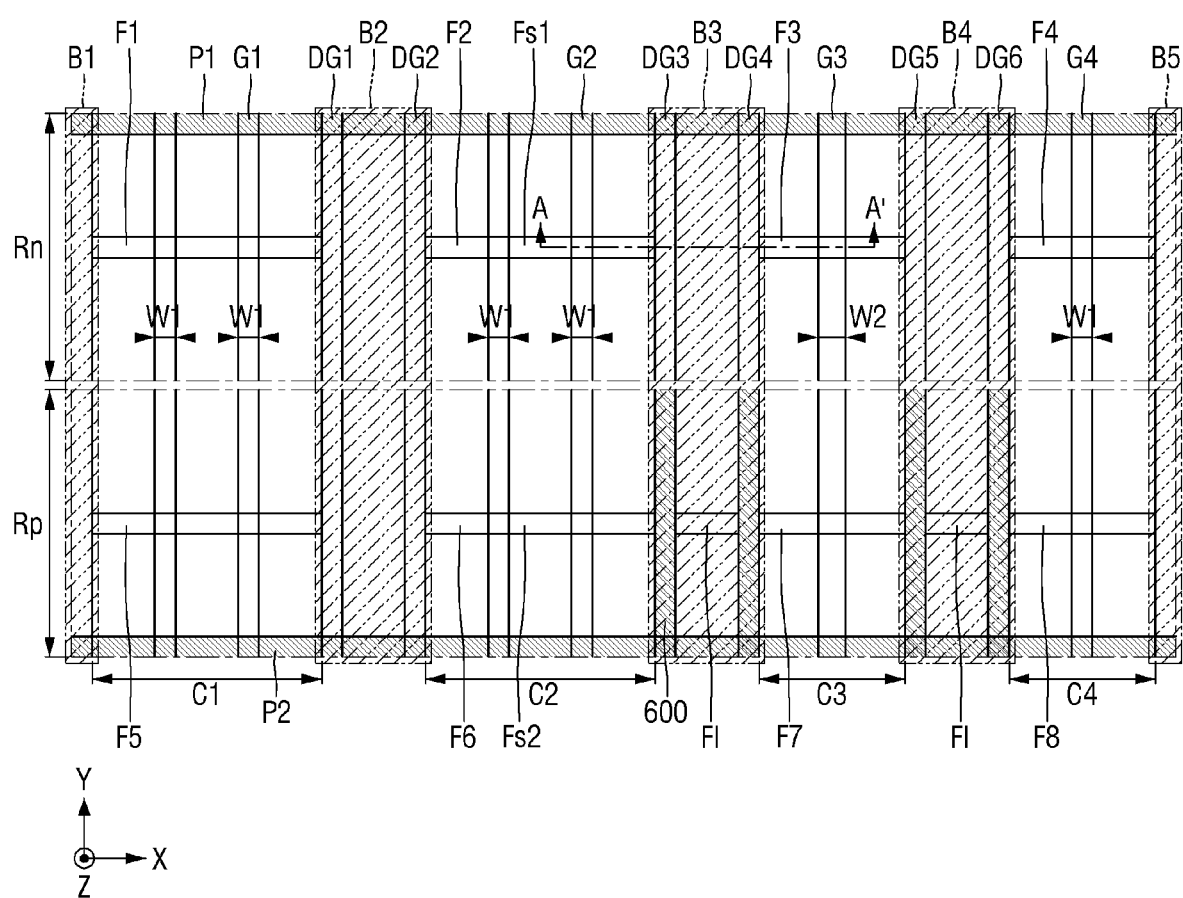
FIG. 20 is a layout diagram for illustrating a semiconductor device according to some exemplary embodiments of the present disclosure.
Figure 21:
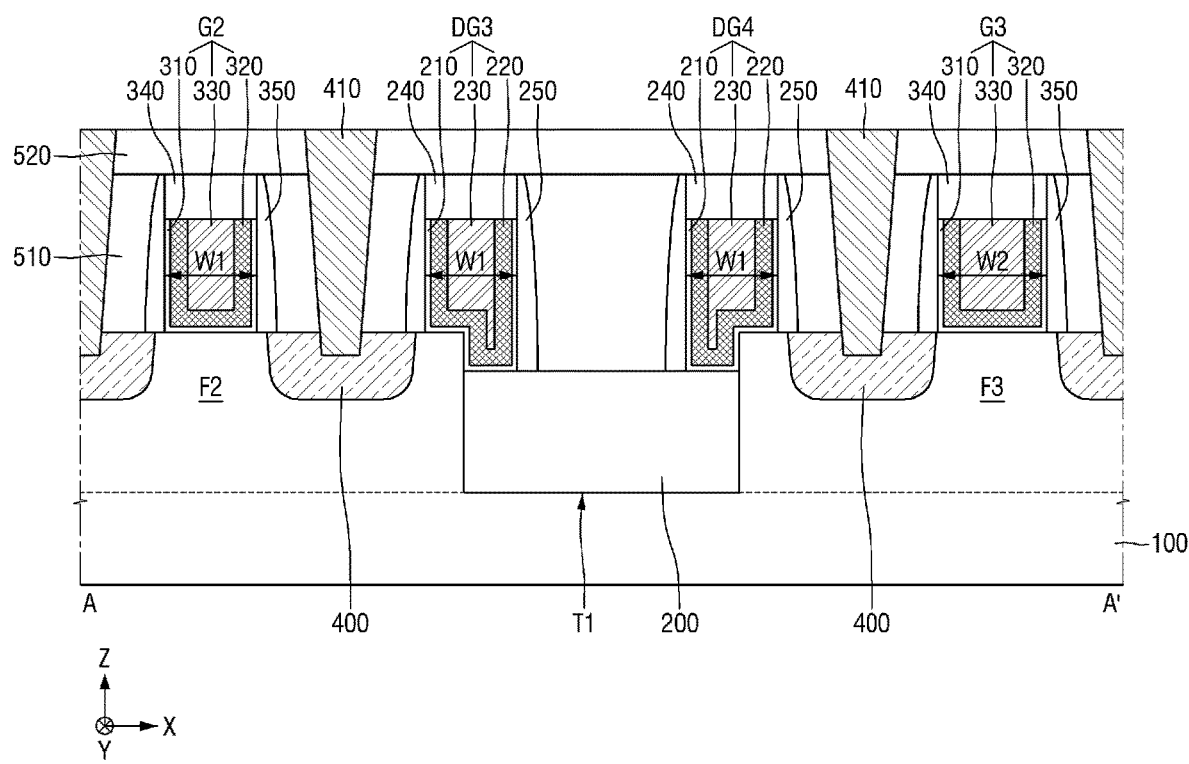
FIG. 21 is a cross-sectional view taken along line A-A' of FIG. 20.

FIG. 20 is a layout diagram for illustrating a semiconductor device according to some exemplary embodiments of the present disclosure, and FIG. 21 is a cross-sectional view taken along line A-A' of FIG. 20.

Referring to FIGS. 20 and 21, in the semiconductor device according to some exemplary embodiments of the present disclosure, gate electrodes of only a third cell C3 may be formed to have a second width W2, and gate electrodes of the remaining cells may be formed to have a first width W1. Further, only a diffusion break structure configured to define the third cell C3 may adopt an MDB film, while the remaining diffusion break structures may adopt a double diffusion break film.

Therefore, in the present embodiment, the difficulty of a process of forming other cells may be reduced, and reliability of other regions may be increased, thereby improving operating characteristics of the entire device and, simultaneously, enabling stable control of a threshold voltage of the third cell C3.

Hereinafter, a semiconductor device according to some exemplary embodiments of the present disclosure will be described with reference to FIGS. 22 to 24. The description of components of the present exemplary embodiment which are the same as those of the above-described exemplary embodiment will be omitted or briefly described.

Figure 22:
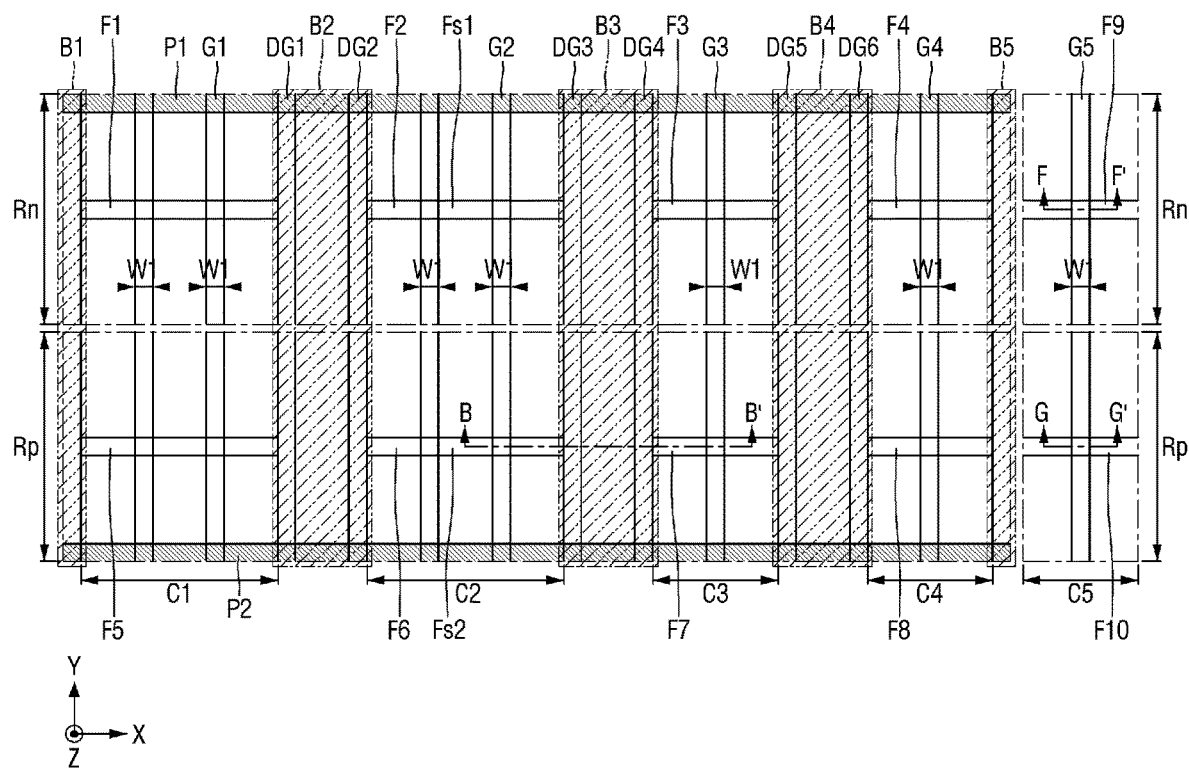
FIG. 22 is a layout diagram for illustrating a semiconductor device according to some exemplary embodiments of the present disclosure.

FIG. 22 is a layout diagram for illustrating a semiconductor device according to some exemplary embodiments of the present disclosure. FIG. 23 is a cross-sectional view taken along lines F-F' and G-G' of FIG. 22. FIG. 24 is a cross-sectional view taken along line B-B' of FIG. 22.

Figure 23:
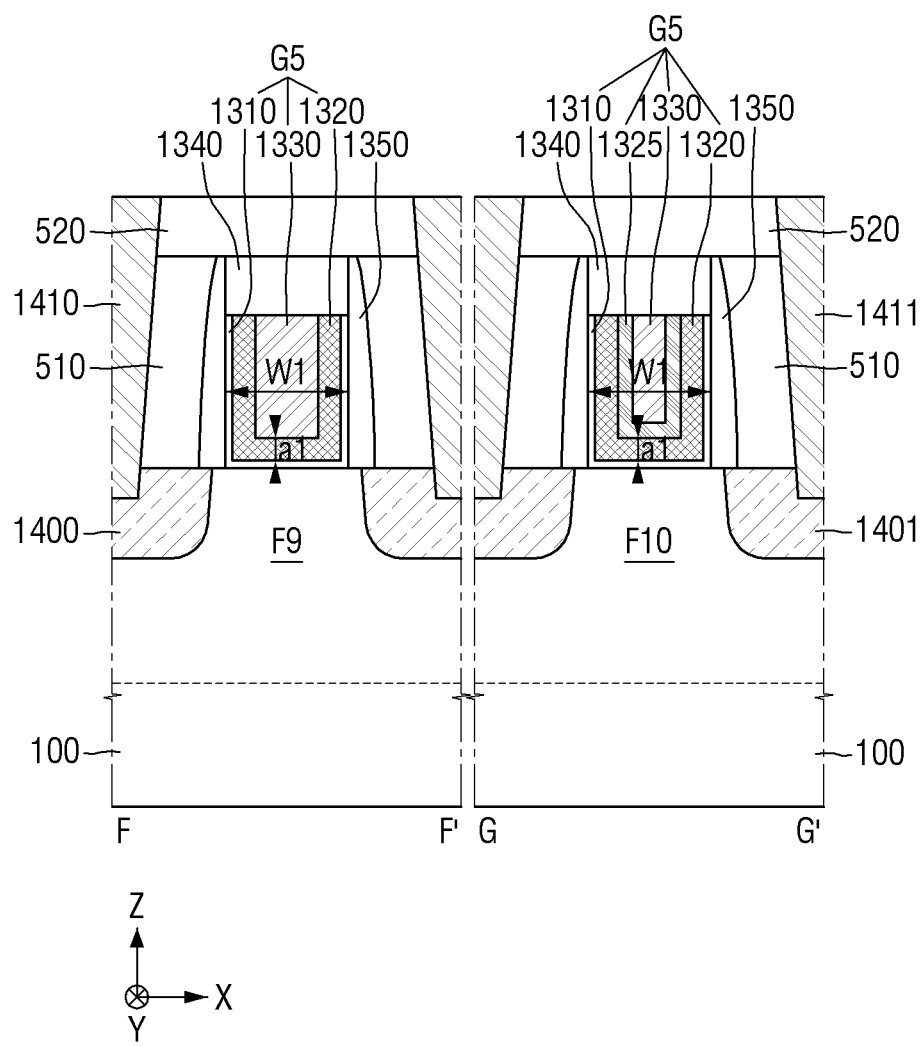
FIG. 23 is a cross-sectional view taken along lines F-F' and G-G' of FIG. 22.
Figure 24:
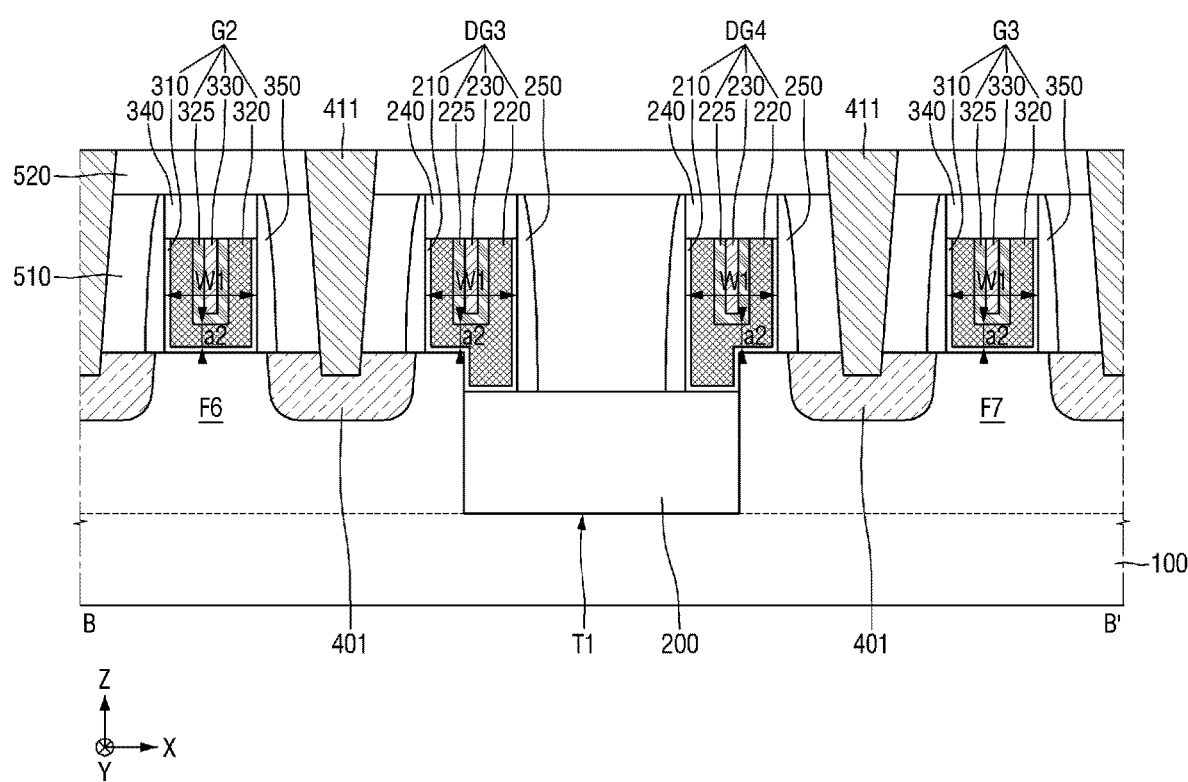
FIG. 24 is a cross-sectional view taken along line B-B' of FIG. 22.

Referring to FIGS. 22 to 24, the semiconductor device according to some exemplary embodiments of the present disclosure may further include a fifth cell C5. A ninth fin F9 and a tenth fin F10 may be disposed in the fifth cell C5. The ninth fin F9 may extend in an n region Rn in a first direction X, and the tenth fin F10 may extend in a p region Rp in the first direction X. The ninth fin F9 and the tenth fin F10 may be spaced apart from each other in a second direction Y. A fifth gate electrode G5 may extend in the second direction Y to cross the ninth fin F9 and the tenth fin F10 on the ninth fin F9 and the tenth fin F10.

First to fifth diffusion break structures B1 to B5 of the semiconductor device according to some exemplary embodiments of the present disclosure may all have a double diffusion break film structure. Unlike in the fifth cell C5, a threshold voltage of a gate electrode of each of the first to fourth cells C1 to C4 may be reduced by using a gate electrode structure in the p region Rp.

Specifically, in the fifth cell C5, the fifth gate electrode G5 may be formed on the ninth fin F9 and the tenth fin F10. The fifth gate electrode G5 may include a second gate insulating film 1310, a third work-function metal 1320, and a second fill metal 1330 in the n region Rn. A second capping film 1340 may be formed on the fifth gate electrode G5, and second spacers 1350 may be formed on side surfaces of the fifth gate electrode G5 and the second capping film 1340.

Third source and drain regions 1400 may be formed in both sides of the fifth gate electrode G5 in the n region Rn, and a third contact 1410 may be formed through a first interlayer insulating film 510 and a second interlayer insulating film 520 and in contact with the third source and drain regions 1400.

The fifth gate electrode G5 may include the second gate insulating film 1310, the third work-function metal 1320, a fourth work-function metal 1325, and the second fill metal 1330 in the p region Rp. The second capping film 1340 may be formed on the fifth gate electrode G5, and the second spacers 1350 may be formed on the side surfaces of the fifth gate electrode G5 and the second capping film 1340.

Fourth source and drain regions 1401 may be formed in both sides of the fifth gate electrode G5 in the p region Rp, and a fourth contact 1411 may be formed through the first interlayer insulating film 510 and the second interlayer insulating film 520 and in contact with the fourth source and drain regions 1401.

In this case, the third work-function metal 1320 may have a first thickness a1 in both the n region Rn and the p region Rp.

In contrast, the first to fourth cells C1 to C4 may have a lower threshold voltage than that of the fifth cell C5 in the p region Rp. To this end, a first work-function metal 320 of each of the first to fourth cells C1 to C4 may have a second thickness a2 which is different from the first thickness a1. For example, the second thickness a2 may be greater than the first thickness a1.

In the present embodiment, a structure of a gate electrode in the p region Rp may be changed to adjust a threshold voltage of the gate electrode, thereby facilitating the stabilization of a distribution of the threshold voltage. As a result, even if the semiconductor device has a single fin structure, a threshold voltage may be stabilized so that the semiconductor device may have improved operating characteristics.

In another case, the semiconductor device according to some exemplary embodiments of the present disclosure may adjust a concentration of a dipole material in a gate insulating film and reduce a threshold voltage of a p region Rp. In this case, the above-described separate process of adjusting a thickness may not be needed. Naturally, in the semiconductor device according to some exemplary embodiments of the present disclosure, a threshold voltage may be adjusted by adjusting both a concentration and a thickness.

Hereinafter, a semiconductor device according to some exemplary embodiments of the present disclosure will be described with reference to FIGS. 22 and 25. The description of components of the present exemplary embodiment which are the same as those of the above-described exemplary embodiment will be omitted or briefly described.

Figure 25:
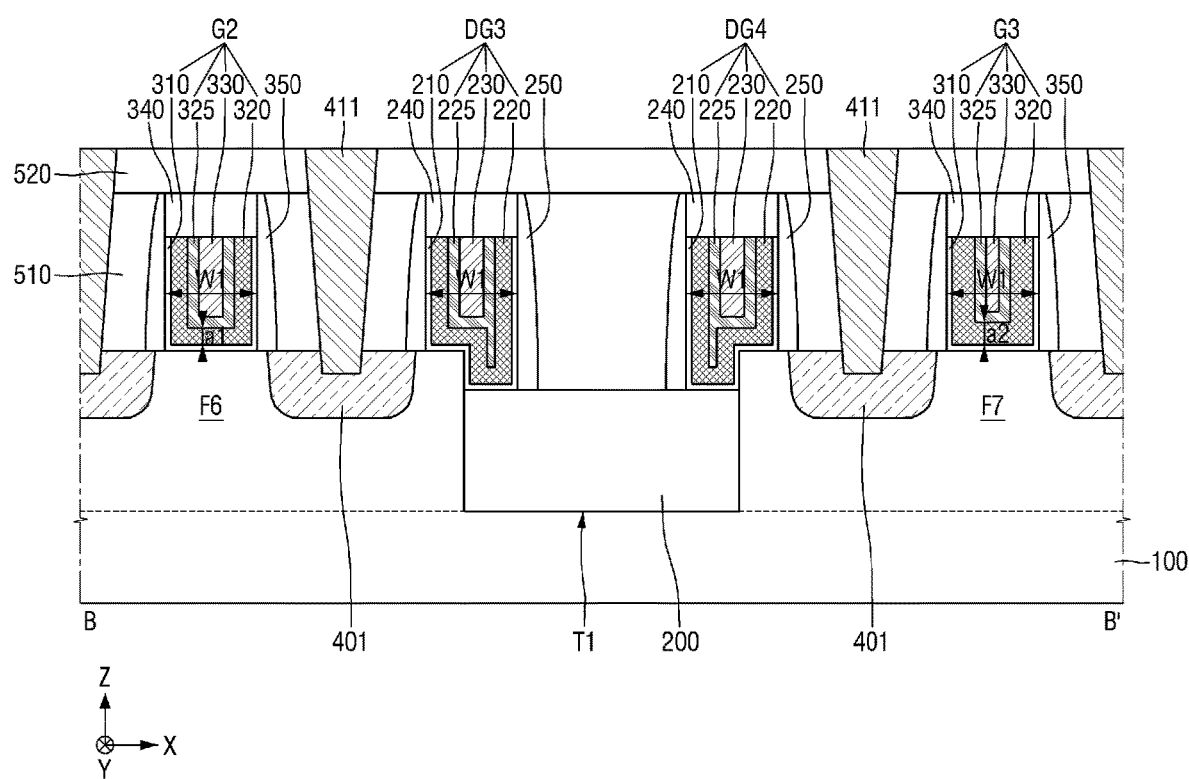
FIG. 25 is a cross-sectional view for illustrating a semiconductor device according to some exemplary embodiments of the present disclosure.

FIG. 25 is a cross-sectional view for illustrating a semiconductor device according to some exemplary embodiments of the present disclosure. FIG. 25 is a cross-sectional view taken along line B-B' of FIG. 22.

Referring to FIGS. 22 and 25, the semiconductor device according to some exemplary embodiments of the present disclosure may adjust a threshold voltage of a p region Rp of a third cell C3 and may not adjust a threshold voltage in other cells. For example, a first work-function metal 320 of each of the first, second, and fourth gate electrodes G1, G2, and G4 may have a first thickness a1 and a first work-function metal 320 of the third gate electrode G3 may have a second thickness a2 greater than the first thickness a1.

Therefore, in the present embodiment, the difficulty of a process of forming other cells may be reduced, and reliability of other regions may be increased, thereby improving operating characteristics of the entire device and, simultaneously, enabling stable control of a threshold voltage of the third cell C3.

Hereinafter, a semiconductor device according to some exemplary embodiments of the present disclosure will be described with reference to FIGS. 26 to 28. The description of components of the present exemplary embodiment which are the same as those of the above-described exemplary embodiment will be omitted or briefly described.

Figure 26:
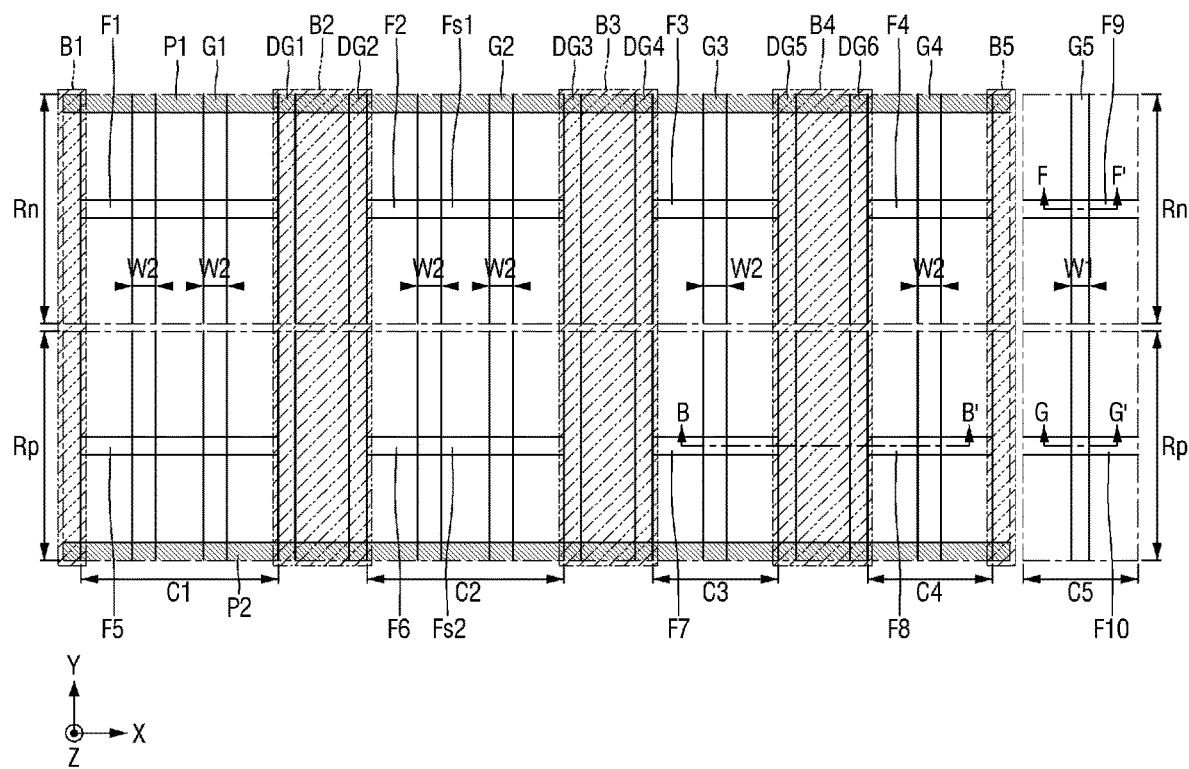
FIG. 26 is a layout diagram for illustrating a semiconductor device according to some exemplary embodiments of the present disclosure.

FIG. 26 is a layout diagram for illustrating a semiconductor device according to some exemplary embodiments of the present disclosure. FIG. 27 is a cross-sectional view taken along lines F-F' and G-G' of FIG. 26. FIG. 28 is a cross-sectional view taken along line B-B' of FIG. 26.

Figure 27:
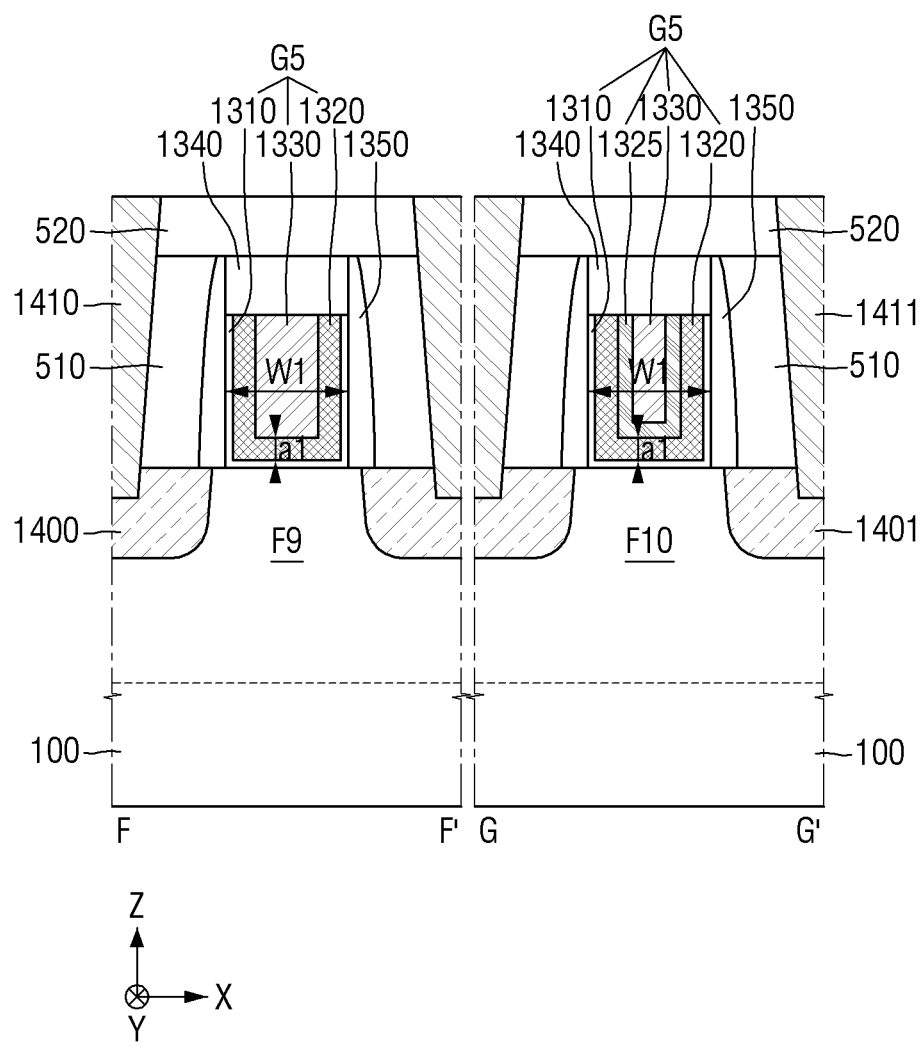
FIG. 27 is a cross-sectional view taken along lines F-F' and G-G' of FIG. 26.
Figure 28:
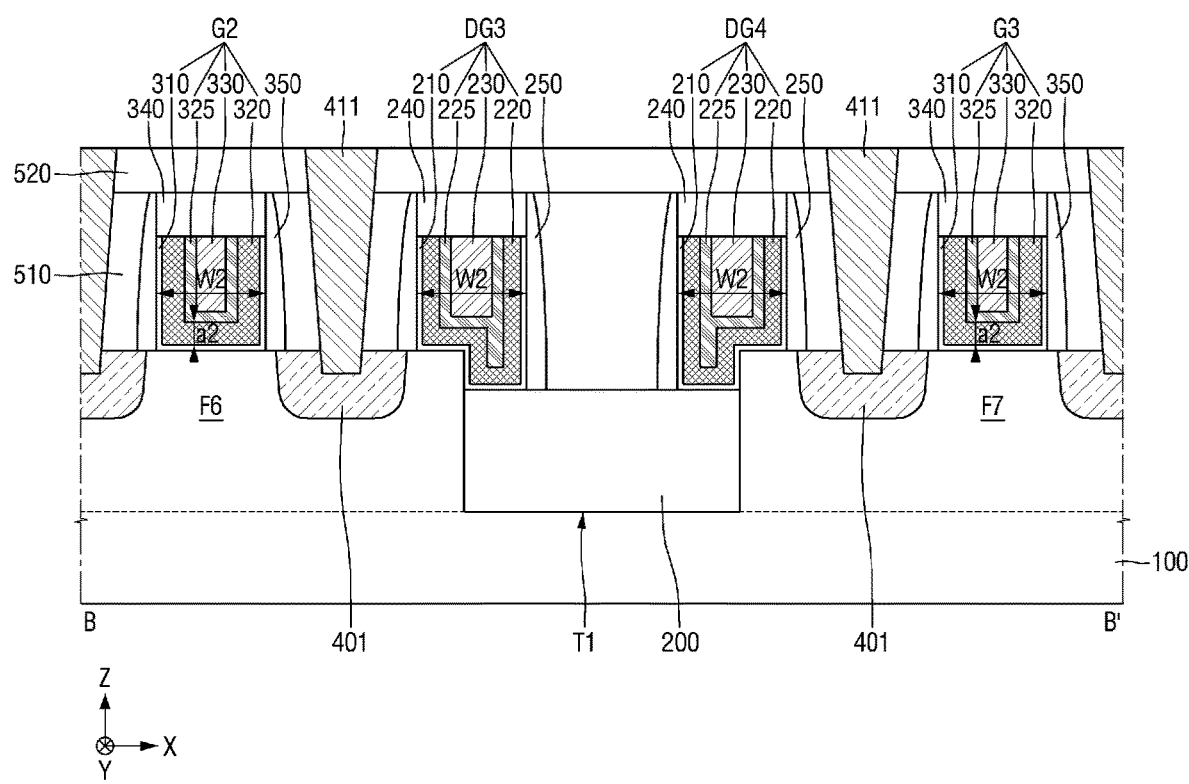
FIG. 28 is a cross-sectional view taken along line B-B' of FIG. 26.

Referring to FIGS. 26 to 28, the semiconductor device according to some exemplary embodiments of the present disclosure may further include a fifth cell C5. A ninth fin F9 and a tenth fin F10 may be disposed in the fifth cell C5. The ninth fin F9 may extend in a first direction X in an n region Rn, and a tenth fin F10 may extend in the first direction X in a p region Rp. The ninth fin F9 and the tenth fin F10 may be spaced apart from each other in a second direction Y. A fifth gate electrode G5 may extend in the second direction Y to cross the ninth fin F9 and the tenth fin F10 on the ninth fin F9 and the tenth fin F10.

The fifth gate electrode G5 of the fifth cell C5 may have a first width W1 in the first direction X, and a third work-function metal 1320 may have a first thickness a1.

By contrast, gate electrodes of first to fourth cells C1 to C4 may have a second width W2 greater than the first width W1 in the first direction X, and a first work-function metal 320 may have a second thickness a2 greater than the first thickness a1. That is, the semiconductor device of the present embodiment may control a threshold voltage by adjusting a channel length using a width and adjusting a thickness of a work-function metal of a gate electrode. Thus, a distribution in threshold voltage of the semiconductor device may be stabilized.

Hereinafter, a semiconductor device according to some exemplary embodiments of the present disclosure will be described with reference to FIGS. 29 and 30. The description of components of the present exemplary embodiment which are the same as those of the above-described exemplary embodiment will be omitted or briefly described.

Figure 29:
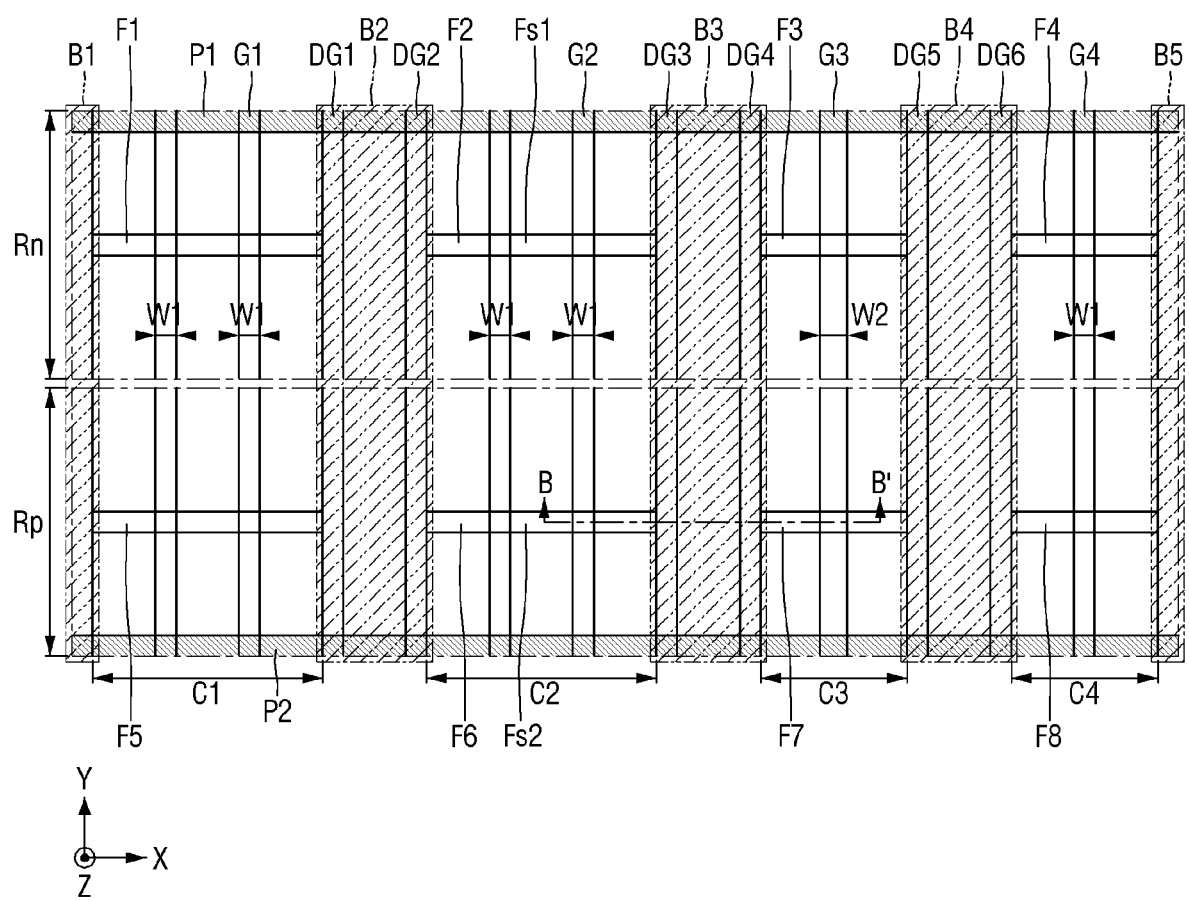
FIG. 29 is a layout diagram for illustrating a semiconductor device according to some exemplary embodiments of the present disclosure.

FIG. 29 is a layout diagram for illustrating a semiconductor device according to some exemplary embodiments of the present disclosure. FIG. 30 is a cross-sectional view taken along line B-B' of FIG. 29.

Figure 30:
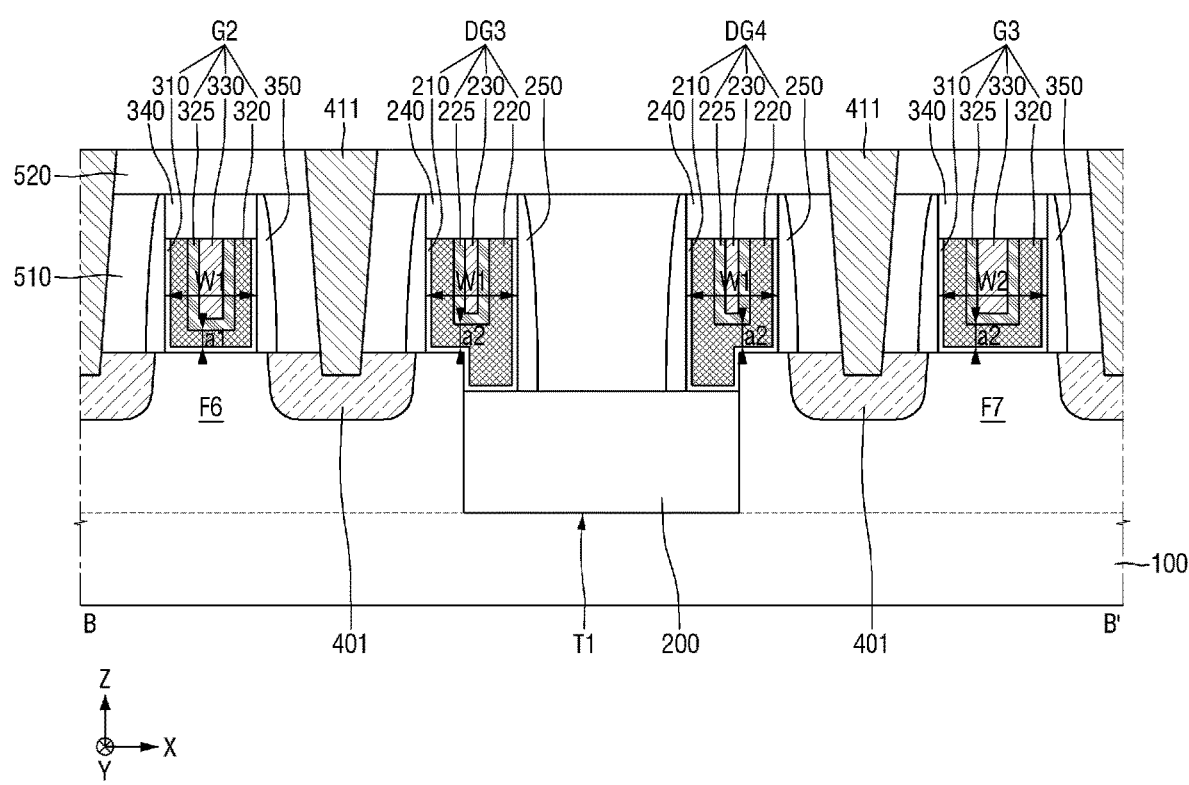
FIG. 30 is a cross-sectional view taken along line B-B' of FIG. 29.

Referring to FIGS. 29 and 30, in the semiconductor device according to some exemplary embodiments of the present disclosure, only in a third cell C3, a width of a third gate electrode G3 may be controlled to be a second width W2, and a thickness of a first work-function metal 320 may be controlled to be a second thickness a2 so that a threshold voltage may be stably controlled. For example, a width of each of the first, second, and fourth gate electrodes G1, G2, and G4 may have a first width W1 and a width of the third gate electrode G3 may have the second width W2 greater than the first width W1. Also, a thickness of a first work-function metal 320 of each of the first, second, and fourth gate electrodes G1, G2, and G4 may have a first thickness a1 and a first work-function metal 320 of the third gate electrode G3 may have the second thickness a2 greater than the first thickness a1.

Therefore, in the present embodiment, the difficulty of a process of forming other cells may be reduced, and reliability of other regions may be increased, thereby improving operating characteristics of the entire device and, simultaneously, enabling stable control of a threshold voltage of the third cell C3.

Hereinafter, a semiconductor device according to some exemplary embodiments of the present disclosure will be described with reference to FIG. 31. The description of components of the present exemplary embodiment which are the same as those of the above-described exemplary embodiment will be omitted or briefly described.

Figure 31:
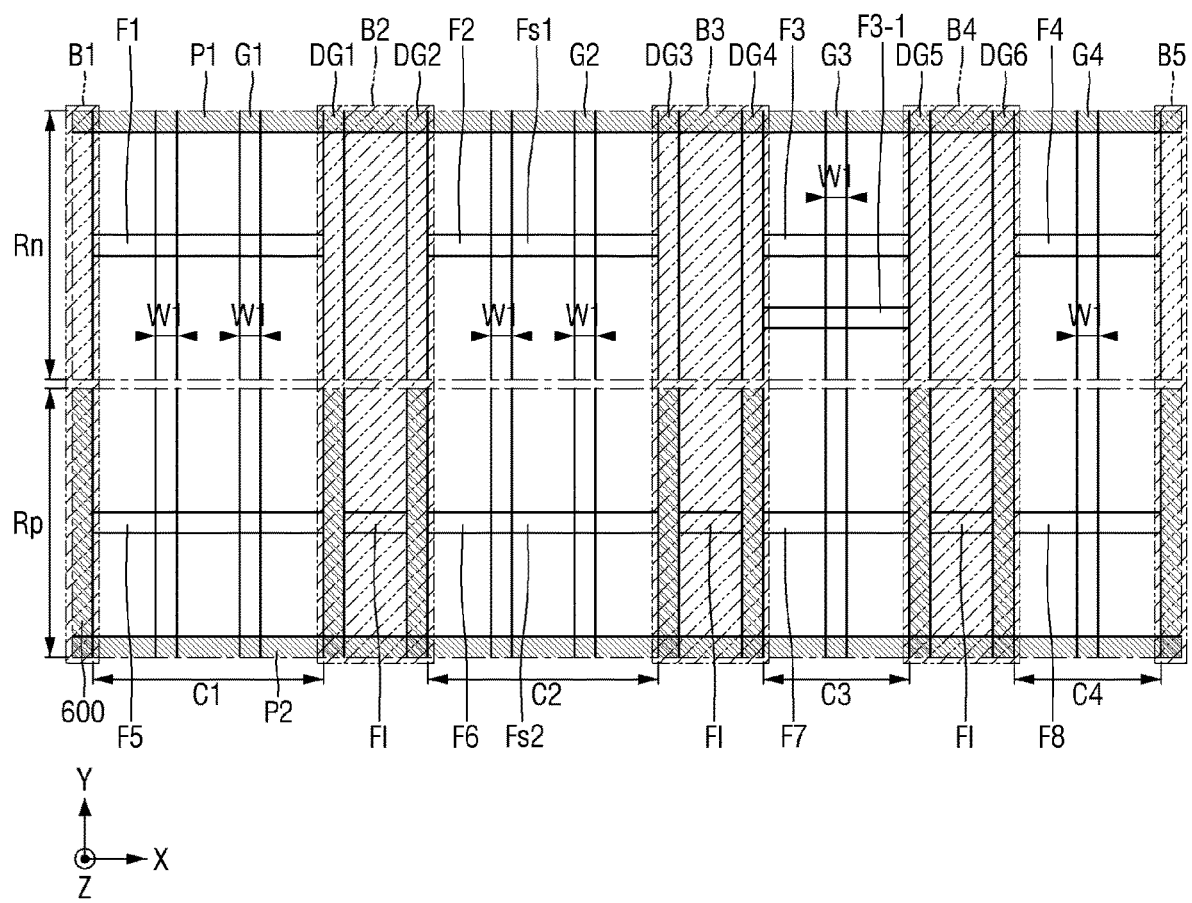
FIG. 31 is a layout diagram for illustrating a semiconductor device according to some exemplary embodiments of the present disclosure.

FIG. 31 is a layout diagram for illustrating a semiconductor device according to some exemplary embodiments of the present disclosure.

Referring to FIG. 31, the semiconductor device according to some exemplary embodiments of the present disclosure may include a 3-$1^{st}$ fin F3-1. For example, a third cell C3 may have a relatively high distribution in threshold voltage due to a layout effect, and a transistor may be formed using a plurality of fins instead of a single fin to stabilize a distribution of an n region Rn.

Accordingly, the present embodiment may reinforce a specific region (i.e., the n region Rn) of the weak third cell C3 with the plurality of fins while taking advantage of a single fin in other cells, thereby improving operating characteristics of the entire device.

Although FIG. 31 illustrates an example in which the 3-$1^{st}$ fin F3-1 is located adjacent to a p region Rp for brevity, the present embodiment is not limited thereto.

Hereinafter, a semiconductor device according to some exemplary embodiments of the present disclosure will be described with reference to FIG. 32. The description of components of the present exemplary embodiment which are the same as those of the above-described exemplary embodiment will be omitted or briefly described.

Figure 32:
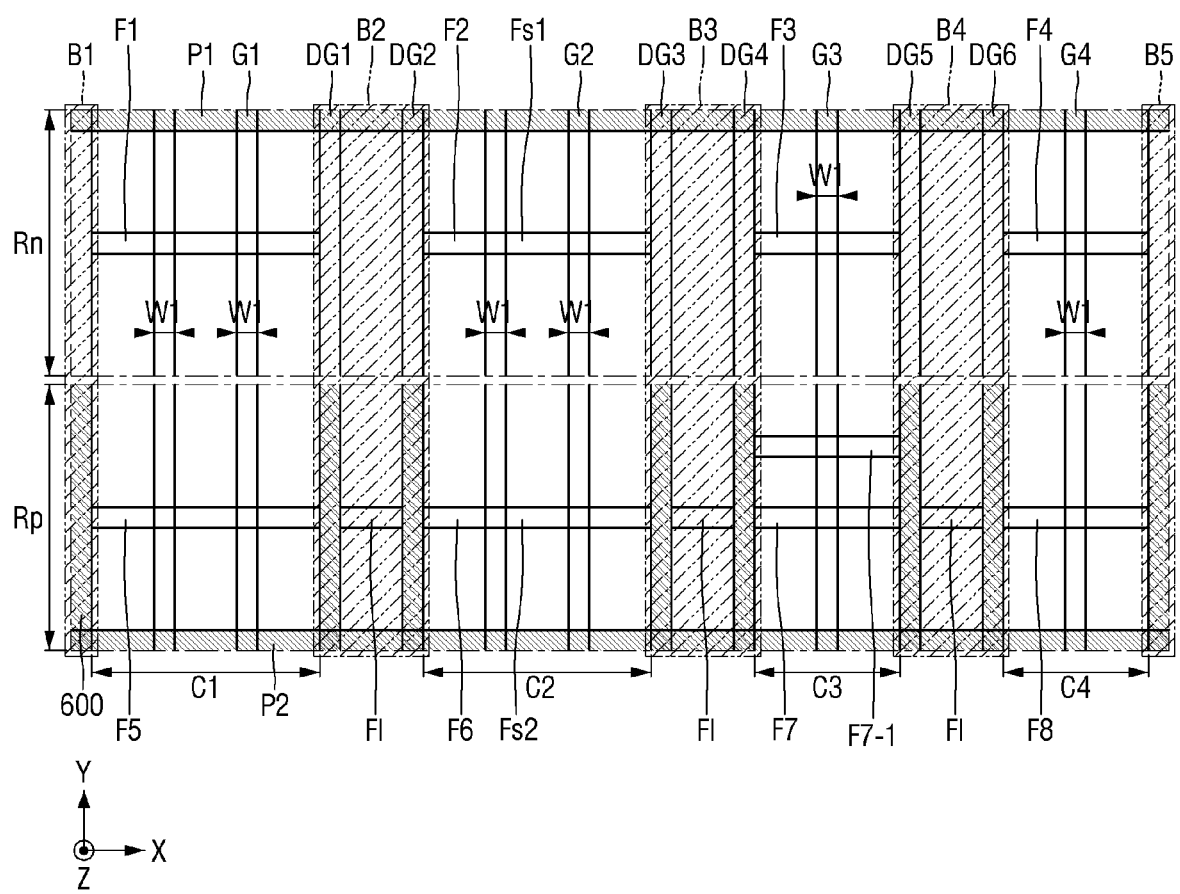
FIG. 32 is a layout diagram for illustrating a semiconductor device according to some exemplary embodiments of the present disclosure.

FIG. 32 is a layout diagram for illustrating a semiconductor device according to some exemplary embodiments of the present disclosure.

Referring to FIG. 32, the semiconductor device according to some exemplary embodiments of the present disclosure may include a 7-1$^{st}$ fin F7-1. That is, a third cell C3 may have a relatively high distribution in threshold voltage due to a layout effect, and a transistor may be formed using a plurality of fins instead of a single fin to stabilize a distribution of a p region Rp.

Accordingly, the present embodiment may reinforce a specific region (i.e., the p region Rp) of the weak third cell C3 with the plurality of fins while taking advantages of a single fin in other cells, thereby improving operating characteristics of the entire device.

Hereinafter, a semiconductor device according to some exemplary embodiments of the present disclosure will be described with reference to FIG. 33. The description of components of the present exemplary embodiment which are the same as those of the above-described exemplary embodiment will be omitted or briefly described.

Figure 33:
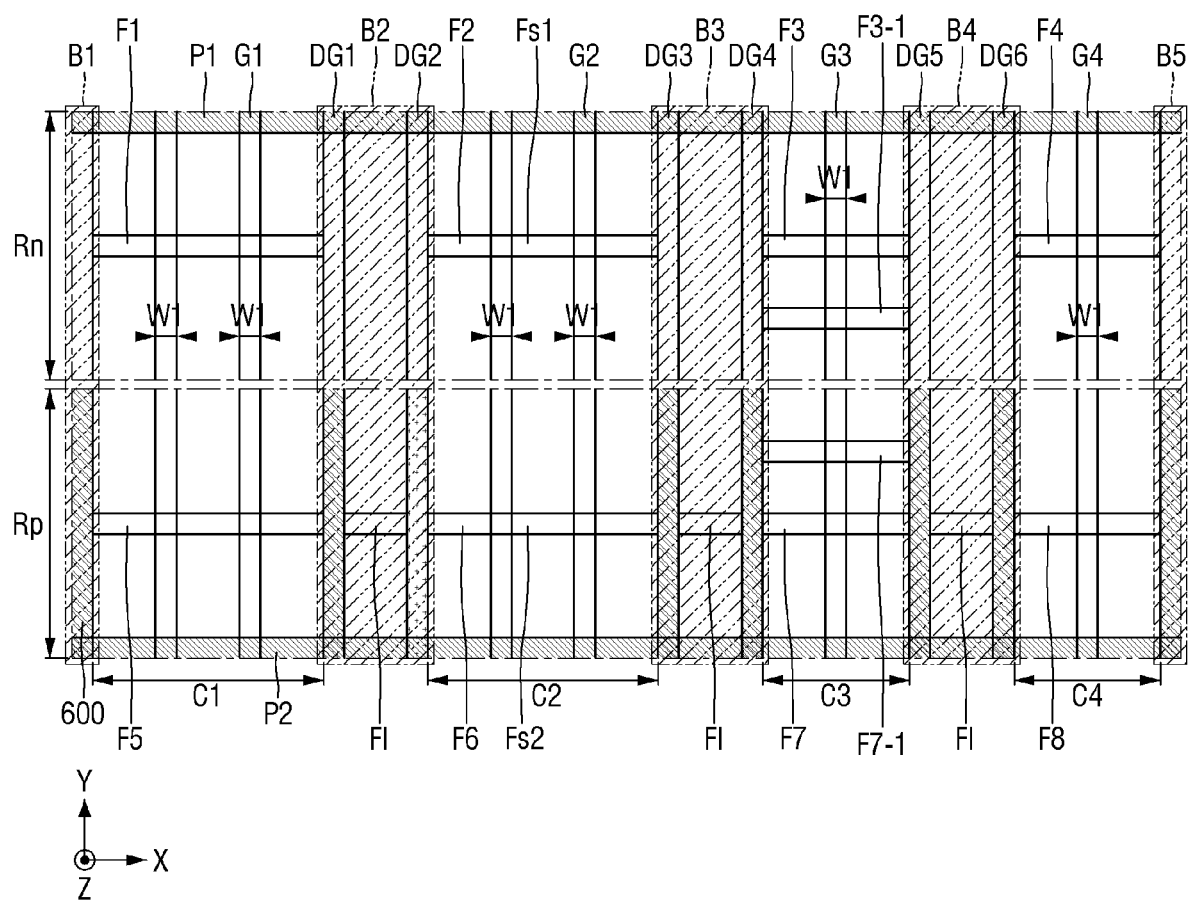
FIG. 33 is a layout diagram for illustrating a semiconductor device according to some exemplary embodiments of the present disclosure.

FIG. 33 is a layout diagram for illustrating a semiconductor device according to some exemplary embodiments of the present disclosure.

Referring to FIG. 33, the semiconductor device according to some exemplary embodiments of the present disclosure may include a 3-1$^{st}$ fin F3-1 and a 7-1$^{st}$ fin F7-1. For example, since a third cell C3 has a relatively high distribution in threshold voltage due to a layout effect, a transistor may be formed using a plurality of fins instead of a single fin.

Accordingly, the present embodiment may reinforce the weak third cell C3 with the plurality of fins while taking advantages of a single fin in other cells, thereby improving operating characteristics of the entire device.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
    first to fourth cells sequentially disposed on a substrate in a first direction;
    first to third diffusion break structures configured to space the first to fourth cells apart from each other, the first diffusion break structure being interposed between the first and second cells, the second diffusion break structure being interposed between the second and third cells, and the third diffusion break structure being interposed between the third and fourth cells;
    a first fin structure configured to protrude from the substrate and extend in the first direction, the first fin structure comprising first to fourth fins separated from each other by the first to third diffusion break structures;
    a second fin structure configured to protrude from the substrate, to be spaced apart from the first fin structure in a second direction intersecting the first direction and extend in the first direction, the second fin structure comprising fifth to eighth fins separated from each other by the first to third diffusion break structures; and
    first to fourth gate electrodes configured to extend in the second direction on the first and second fin structures, the first to fourth gate electrodes being disposed in the first to fourth cells, respectively,
    wherein each of the first to fourth gate electrodes intersects the first fin structure at an n region of the substrate and the second fin structure at a p region of the substrate, and
    the number of fins in each of the first, second, and fourth cells is two.

2. The semiconductor device of claim 1, wherein the number of fins in the third cell is at least three.

3. The semiconductor device of claim 1, wherein each of the second and third diffusion break structures comprises a first portion in contact with the first fin structure and a second portion in contact with the second fin structure,
    wherein the first portion comprises a double diffusion break film including two dummy gate electrodes, and
    wherein the second portion comprises a single diffusion break film including one dummy source and drain region.

4. The semiconductor device of claim 3, wherein the first diffusion break structure comprises the double diffusion break film.

5. The semiconductor device of claim 3, wherein a width of the third gate electrode in the first direction is different from a width of each of the first, second, and fourth gate electrodes in the first direction.

6. The semiconductor device of claim 1, further comprising:
    a fifth cell different from each of the first to fourth cells;
    a ninth fin configured to extend in the fifth cell in the first direction; and
    a fifth gate electrode configured to extend in the second direction on the ninth fin,
    wherein a width of each of the first to fourth gate electrodes in the first direction is greater than a width of the fifth gate electrode in the first direction.

7. The semiconductor device of claim 1, wherein each of the first to fourth gate electrodes at the n region includes an n-type work-function control material, and
    wherein each of the first to fourth gate electrodes at the p region includes a p-type work-function control material and an n-type work-function control material disposed on the p-type work-function control material.

8. The semiconductor device of claim 7, wherein all the first to fourth cells at the n region have the same threshold voltage, and
    wherein a threshold voltage of the third cell at the p region is lower than a threshold voltage of each of the first, second, and fourth cells at the p region.

9. The semiconductor device of claim 1, further comprising:
    a fifth cell different from each of the first to fourth cells;
    a ninth fin configured to extend in the first direction in the fifth cell; and
    a fifth gate electrode configured to extend in the second direction on the ninth fin, the fifth gate electrode extending at the n region and the p region,
    wherein a threshold voltage of each of the first to fourth cells at the p region is lower than a threshold voltage of the fifth cell at the p region.

10. The semiconductor device of claim 1, further comprising a groove configured to protrude from the substrate at a lower level than the first and second fin structures and extend in the first direction, the groove being spaced apart from the first and second fin structures in the first direction.

11. The semiconductor device of claim 1, further comprising a fin cut trench interposed between the first and second fin structures, the fin cut trench having a bottom surface located at a lower level than a top surface of the substrate.

12. A semiconductor device comprising:
a substrate comprising an n region and a p region;
a first fin provided with the substrate in the n region, and extending in a first direction;
a second fin provided with the substrate in the p region, and extending in the first direction, the second fin being spaced apart from the first fin in a second direction intersecting the first direction;
a gate electrode configured to extend in the second direction on the first and second fins;
a field insulating film configured to be in contact with a side surface of the first fin in the first direction;
a first dummy gate formed on the n region and formed on a top surface of the field insulating film and a top surface of the first fin, the first dummy gate being configured to extend in the second direction; and
a single diffusion break film formed on the p region and aligned with the first dummy gate in the second direction, the single diffusion break film being in contact with the side surface of the second fin in the first direction.

13. The semiconductor device of claim 12, further comprising an isolated fin spaced apart from the second fin by the single diffusion break film.

14. The semiconductor device of claim 13, further comprising a dummy source and drain region formed on the isolated fin.

15. The semiconductor device of claim 14, wherein the dummy source and drain region comprises silicon germanium (SiGe).

16. A semiconductor device comprising:
a substrate;
a first power rail and a second power rail configured to extend in a first direction on the substrate, the first and second power rails being spaced apart from each other in a second direction intersecting the first direction;
a first fin configured to protrude from the substrate and extend in the first direction;
a second fin configured to protrude from the substrate and extend in the first direction, the second fin being spaced apart from the first fin in the second direction;
a first diffusion break structure and a second diffusion break structure configured to define both ends of the first and second fins; and
a gate electrode configured to extend on the first and second fins in the second direction,
wherein the first fin is a fin nearest to the first power rail in the second direction, the second fin is a fin nearest to the second power rail in the second direction, and the first fin and the second fin have no fins between them in the second direction.

17. The semiconductor device of claim 16, wherein each of the first and second diffusion break structures:
contacts the first fin at an n region of the substrate and the second fin at a p region of the substrate,
comprises a double diffusion break film formed in the n region, and
comprises a single diffusion break film formed in the p region.

18. The semiconductor device of claim 17, wherein the double diffusion break film comprises:
a trench defined by a side surface of the first fin;
a field insulating film configured to fill a portion of the trench;
a first dummy gate electrode formed on the field insulating film and the first fin, the first dummy gate electrode being configured to extend in the second direction; and
a second dummy gate electrode formed on a portion of the field insulating film and configured to extend in the second direction, the second dummy gate electrode being spaced apart from the first dummy gate electrode in the first direction.

19. The semiconductor device of claim 18, wherein the single diffusion break film comprises:
a first single diffusion break film aligned with the first dummy gate electrode in the second direction; and
a second single diffusion break film aligned with the second dummy gate electrode in the second direction.

20. The semiconductor device of claim 19, wherein each of the first and second single diffusion break films comprises a different material from the field insulating film.

* * * * *